(12) United States Patent
Asatani et al.

(10) Patent No.: US 10,964,237 B2
(45) Date of Patent: Mar. 30, 2021

(54) DISPLAY DEVICE, METHOD FOR PRODUCING DISPLAY DEVICE, AND METHOD FOR INSPECTING DISPLAY DEVICE

(71) Applicant: SHARP KABUSHIKI KAISHA, Sakai (JP)

(72) Inventors: Shuhichiroh Asatani, Sakai (JP); Daiji Kitagawa, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 76 days.

(21) Appl. No.: 16/225,916

(22) Filed: Dec. 19, 2018

(65) Prior Publication Data
US 2019/0197932 A1 Jun. 27, 2019

(30) Foreign Application Priority Data
Dec. 27, 2017 (JP) .............................. JP2017-251617

(51) Int. Cl.
*G09G 3/00* (2006.01)
*G02F 1/1345* (2006.01)
(Continued)

(52) U.S. Cl.
CPC ......... *G09G 3/006* (2013.01); *G02F 1/13338* (2013.01); *G02F 1/13452* (2013.01);
(Continued)

(58) Field of Classification Search
CPC ........... G02F 1/136286; G02F 1/13338; G02F 1/1345; G02F 1/13452; G02F 1/13306; G02F 2201/121; G02F 1/133; G02F 2201/123; G06F 3/044; G06F 2203/04112; G06F 2203/04111; G06F 1/1637; G06F 1/1641; G06F 1/1652; G06F 1/1616; G06F 2203/0339; G06F 3/047; G06F 3/0416; G06F 3/0412; G09G 3/3648; G09G 3/3659; G09G 3/342; G09G 3/3233;
(Continued)

(56) References Cited

U.S. PATENT DOCUMENTS

| | | | |
|---|---|---|---|
| 6,755,000 B2 * | 6/2004 | Wone Hahn | E04F 19/0436 52/287.1 |
| 6,917,408 B2 * | 7/2005 | Nishino | G02F 1/1345 349/149 |

(Continued)

FOREIGN PATENT DOCUMENTS

| | | | |
|---|---|---|---|
| JP | 2000-250057 A | | 9/2000 |
| JP | 2000250057 | * | 9/2000 |

*Primary Examiner* — Vinh P Nguyen
(74) *Attorney, Agent, or Firm* — ScienBiziP, P.O.

(57) ABSTRACT

The present invention provides a display device, a method for producing a display device, and a method for inspecting a display device, which are capable of inspecting, after bonding of a display panel and a FPC to each other, a conductive line formed near an edge of the display panel and/or an edge of the FPC for open circuits, partial open circuits, and short circuits. The display device includes: a display panel; a flexible printed circuit connected to the display panel; and an inspection line formed along one or both of an edge of the display panel and an edge of the flexible printed circuit and including a capacitance-forming portion that exhibits capacitance.

21 Claims, 11 Drawing Sheets

(51) Int. Cl.
*G02F 1/1333* (2006.01)
*H05K 1/18* (2006.01)
*G06F 3/044* (2006.01)
*G06F 3/041* (2006.01)

(52) U.S. Cl.
CPC ............ *G06F 3/044* (2013.01); *G06F 3/0412* (2013.01); *G06F 3/0416* (2013.01); *H05K 1/189* (2013.01); *G02F 2201/121* (2013.01); *G02F 2201/123* (2013.01); *G06F 3/0443* (2019.05)

(58) Field of Classification Search
CPC ......... G09G 2300/0426; G09G 3/3688; G09G 2310/0262; G09G 3/3406; G09G 3/36; G09G 3/3607; G09G 2300/0408; G09G 2300/088; G09G 2300/0885; G09G 2310/0202; G09G 2330/08; G09G 3/3225; G09G 3/3258; G09G 3/3275; G09G 3/3413; G09G 3/3426; G09G 3/006; H01L 27/3262; H01L 27/3244; H01L 2251/5338; H01L 23/49838; H01L 29/45; H01L 51/525; G02B 26/08; G02B 30/00; H05K 1/189; H05K 1/0298

See application file for complete search history.

(56) References Cited

U.S. PATENT DOCUMENTS

| | | | | |
|---|---|---|---|---|
| 7,948,459 | B2* | 5/2011 | Ohtomo | G09G 3/006 |
| | | | | 345/87 |
| 8,704,762 | B2* | 4/2014 | Anno | G02F 1/133512 |
| | | | | 345/156 |
| 9,287,329 | B1* | 3/2016 | Lee | H01L 51/5262 |
| 9,324,252 | B2* | 4/2016 | Zhuang | G09G 3/006 |
| 9,875,699 | B2* | 1/2018 | Fujikawa | G02F 1/13452 |
| 10,712,887 | B2* | 7/2020 | Yoshida | G06F 3/0443 |
| 2014/0078415 | A1* | 3/2014 | Tanabe | G02F 1/133509 |
| | | | | 349/12 |

* cited by examiner (Back surface)

DISPLAY DEVICE, METHOD FOR PRODUCING DISPLAY DEVICE, AND METHOD FOR INSPECTING DISPLAY DEVICE

CROSS-REFERENCE TO RELATED APPLICATIONS

The present application claims priority under 35 U.S.C. § 119 to Japanese Patent Application No. 2017-251617 filed on Dec. 27, 2017, the contents of which are incorporated herein by reference in their entirety.

BACKGROUND OF THE INVENTION

Field of the Invention

The present invention relates to display devices, methods for producing a display device, and methods for inspecting a display device. Specifically, the present invention relates to a display device including a display panel and a flexible printed circuit connected to the display panel, a method for producing the display device, and a method for inspecting the display device.

Description of Related Art

Display devices such as liquid crystal displays, organic electroluminescent displays, and plasma displays include a display panel for displaying images and a flexible printed circuit (FPC) connected to the display panel. The display panel and the flexible printed circuit include many various conductive lines formed therein.

JP 2000-250057 A, for example, discloses a method for inspecting a conductive line in such a display device for defects. In the method, a conductive plate is stacked on a surface of a transparent substrate having many patterned transparent electrodes, with a very small gap or an insulating film in between. In the stacked state, the capacitance between each of the patterned transparent electrodes and the conductive plate is measured. Thereby, the liquid crystal display device is inspected for short circuits of any of the patterned transparent electrodes.

As to the method for inspecting conductive lines for open circuits, there is a liquid crystal display device that includes an inspection line composed of a simple conductive line on the TFT substrate to surround the display region. The device inputs an inspection signal to one end of the inspection line and detects the inspection signal at the other end.

BRIEF SUMMARY OF THE INVENTION

When a display device including a display panel and a FPC receives an external shock such as a dropping shock, the display device may receive stress and may be cracked or chipped (e.g., chipped in a V shape). These cracks and chips are likely to occur especially near the edges of the display panel and the FPC. Cracks may cut off a conductive line on the display panel and/or the FPC to cause an open circuit of the line or may cut off part of a conductive line to cause a partial open circuit of the line. Chips may cause a partial loss of a conductive line to cause an open circuit of the line.

Such an open circuit and a partial open circuit of a conductive line on the display panel and/or the FPC can cause display defects of the display device. Also, in the case where the display device has a touch panel (TP) function, an open circuit and a partial open circuit of a conductive line can affect the TP performance.

Cracks and chips in a display device are typically checked using a microscope or an X-ray device. However, it is difficult to predict a cracked or chipped site, and the site may not be easily pinpointed. Even when the cracked or chipped site is found, especially in the case of a cracked site, the conductive line may be difficult to inspect for actual open circuits or partial open circuits using a microscope or an X-ray device.

Defects of conductive lines in a display device include a short circuit as well as open circuits and partial open circuits. A short circuit of a conductive line can occur anywhere in the entire display panel and the entire FPC, and therefore can occur in the vicinity of an edge of a display panel and/or an edge of a FPC.

According to JP 2000-250057 A, each patterned transparent electrode can be inspected for short circuits before two transparent substrates of the liquid crystal display device are bonded to each other. JP 2000-250057 A, however, fails to disclose a method for inspecting conductive lines for open circuits and partial open circuits. Also, the inspection method disclosed in JP 2000-250057 A cannot be used after production of a display panel, e.g., after connection of a display panel and a FPC to each other.

In the inspection method utilizing determination lines composed of simple conductive lines, detection of an inspection signal at the other end means no open circuit of the determination line, and detection of no inspection signal at the other end means an open circuit of the determination line. Here, if a determination line is partially but significantly open-circuited, an inspection signal would not be detected, and thus a determination would be made that the conductive line is open-circuited. However, when the determination line is partially, slightly open-circuited, an inspection signal may be detected, and thus a determination may be made that the conductive line is not open-circuited. Also, an inspection signal may be detected at the other end even when a conductive line is short-circuited, and the conductive line may not be determined to be short-circuited. It may therefore be difficult to inspect for partial open circuits and short circuits using this method.

In response to the above issues, an object of the present invention is to provide a display device, a method for producing a display device, and a method for inspecting a display device, which are capable of inspecting, after bonding of a display panel and a FPC to each other, conductive lines formed near an edge of the display panel and/or an edge of the FPC for open circuits, partial open circuits, and short circuits.

The present inventors made various studies on a display device, a method for producing a display device, and a method for inspecting a display device, which are capable of inspecting, after bonding of a display panel and a FPC to each other, conductive lines formed near an edge of the display panel and/or an edge of the FPC for open circuits, partial open circuits, and short circuits. The inventors then focused on formation of an additional inspection line including a capacitance-forming portion exhibiting capacitance on the display panel and/or the FPC. Good display devices without any defects such as an open circuit, a partial open circuit, or a short circuit are produced under the same conditions based on the same design. Inspection lines in good display devices therefore exhibit capacitance within a predetermined range, though slightly varying. However, if the inspection line is open-circuited, partially open-circuited, or short-circuited, the capacitance of the inspection line goes beyond the predetermined range. The inventors thereby found that the inspection line can be inspected for open circuits, partial open circuits, and short circuits by measuring the capacitance of the inspection line formed in the display device, which is the inspection target, even after the display panel and the FPC are connected to each other.

Cracks and chips in a display device are likely to occur over a certain range (region), and neighboring conductive lines on the same substrate are likely to be open-circuited and/or partially open-circuited collectively. Thus, when the inspection line is open-circuited and/or partially open-circuited, a conductive line near the inspection line is highly likely to be open-circuited and/or partially open-circuited. Also, when a conductive line is short-circuited, it is short-circuited with one or more conductive lines adjacent thereto. Thus, when the inspection line is short-circuited, at least one conductive line adjacent to the inspection line is highly likely to be short-circuited. In light of this issue, the inventors formed the inspection line along one or both of an edge of the display panel and an edge of the flexible printed circuit. This structure was found to allow inspection of conductive lines near the inspection line, i.e., near one or both of the edge of the display panel and the edge of the FPC, which are vulnerable to external damages, for open circuits, partial open circuits, and short circuits. Thereby, the inventors successfully achieved the above object, completing the present invention.

In other words, one aspect of the present invention may be a display device including: a display panel; a flexible printed circuit connected to the display panel; and an inspection line formed along one or both of an edge of the display panel and an edge of the flexible printed circuit and including a capacitance-forming portion that exhibits capacitance.

The inspection line may include a conductive line portion and, as the capacitance-forming portion, a wide portion having a greater width than the conductive line portion.

The wide portion may be formed at an end of the conductive line portion.

The wide portion may be formed in an intermediate portion of the conductive line portion.

The inspection line may include a plurality of the wide portions, and the wide portions may be spaced from each other.

The wide portions may exhibit the same capacitance.

The capacitance-forming portion of the inspection line includes two conductive line portions that are formed side by side, and one of the two conductive line portions may be grounded.

The display device may further include a capacitance detector that is connected to the inspection line and configured to detect capacitance of the inspection line.

The display device may further include an external pad that is formed on one or both of the display panel and the flexible printed circuit and connected to the inspection line.

The inspection line may be formed along the entire edge of the display panel except for a site connected to the flexible printed circuit and along the entire edge of the flexible printed circuit except for a site connected to the display panel.

Another aspect of the present invention may be a method for producing a display device including a display panel and a flexible printed circuit connected to the display panel, the method including: forming, along one or both of an edge of the display panel and an edge of the flexible printed circuit, an inspection line including a capacitance-forming portion that exhibits capacitance; connecting the flexible printed circuit to the display panel; and measuring capacitance of the inspection line after the connecting so as to inspect the inspection line for open circuits, partial open circuits, or short circuits based on the measured capacitance.

The inspecting may include comparing the capacitance with a predetermined threshold.

The inspection line may include a conductive line portion and, as the capacitance-forming portion, a wide portion having a greater width than the conductive line portion, and the inspecting may include bringing a director into contact with or close to the wide portion.

Yet another aspect of the present invention may be a method for inspecting a display device including a display panel and a flexible printed circuit connected to the display panel, the display device including an inspection line formed along one or both of an edge of the display panel and an edge of the flexible printed circuit and including a capacitance-forming portion that exhibits capacitance, the method including measuring capacitance of the inspection line so as to inspect the inspection line for open circuits, partial open circuits, or short circuits based on the measured capacitance.

The inspecting may include comparing the capacitance with a predetermined threshold.

The inspection line may include a conductive line portion and, as the capacitance-forming portion, a wide portion having a greater width than the conductive line portion, and the inspecting may include bringing a director into contact with or closer to the wide portion.

The present invention can provide a display device, a method for producing a display device, and a method for inspecting a display device, which are capable of inspecting, after bonding of a display panel and a FPC to each other, conductive lines formed near an edge of the display panel and/or an edge of the FPC for open circuits, partial open circuits, and short circuits.

DETAILED DESCRIPTION OF THE INVENTION

Hereinafter, embodiments of the present invention are described. The embodiments, however, are not intended to limit the scope of the present invention. The designs in the embodiments may appropriately be modified within the spirit of the present invention. The identical reference signs are used to denote identical members or members having similar functions throughout the views, and description of these members will not be repeated. The configurations in the embodiments and modified examples may appropriately be combined or modified within the spirit of the present invention.

Embodiment 1

Figure 1:
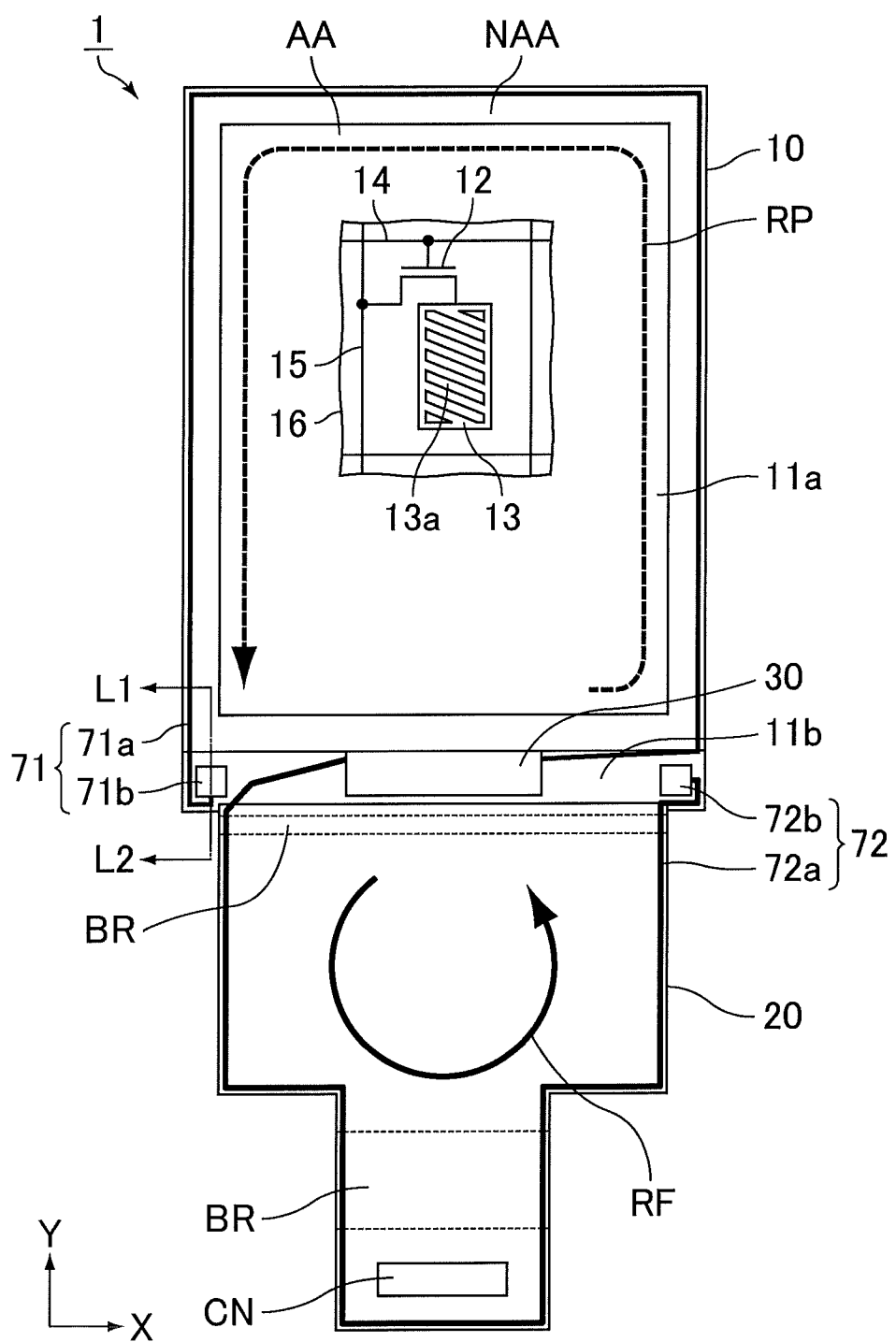
FIG. 1 is a schematic plan view of a display device of Embodiment 1.
Figure 2:
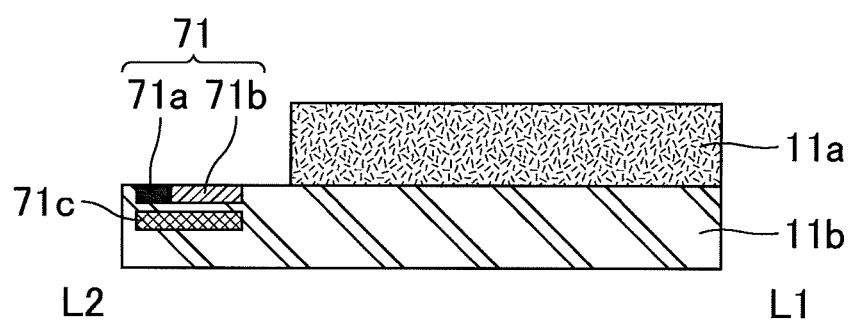
FIG. 2 is a schematic cross-sectional view of a display panel in the display device of Embodiment 1.
Figure 3:
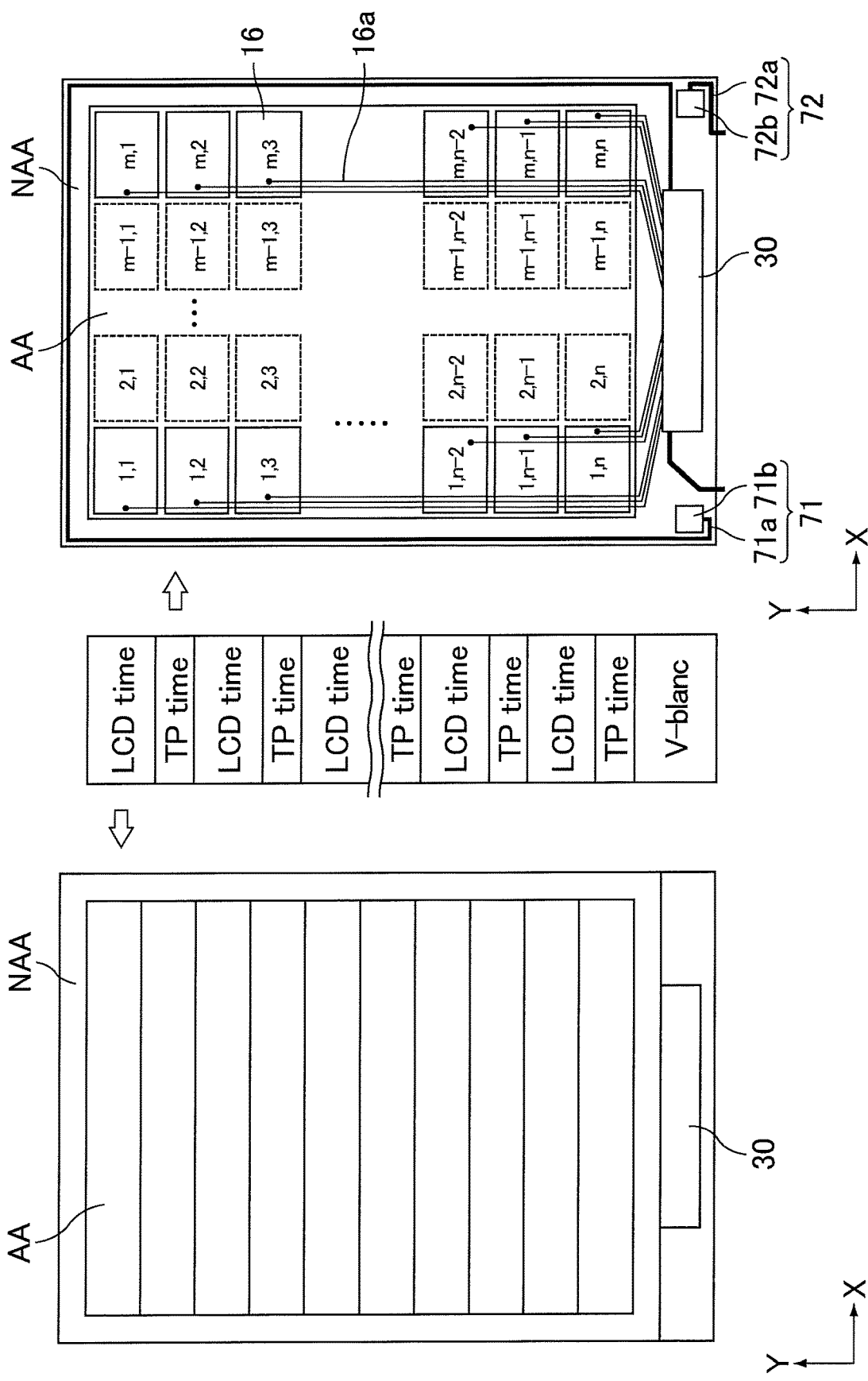
FIG. 3 is a schematic plan view of the display panel in the display device of Embodiment 1.
Figure 4:
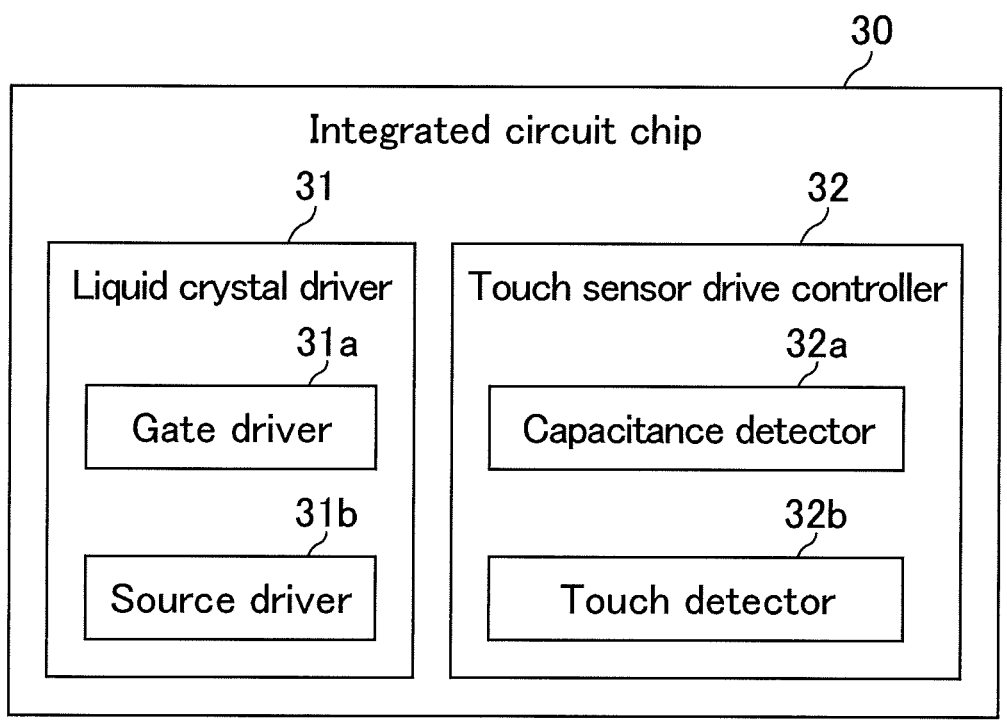
FIG. 4 is a functional block diagram of an integrated circuit chip in the display device of Embodiment 1.

FIG. 1 is a schematic plan view of a display device of Embodiment 1. FIG. 2 is a schematic cross-sectional view of a display panel in the display device of Embodiment 1. FIG. 3 is a schematic plan view of the display panel in the display device of Embodiment 1. FIG. 4 is a functional block diagram of an integrated circuit chip in the display device of Embodiment 1. FIG. 2 shows a cross section taken along the line L1-L2 shown in FIG. 1.

A display device 1 of the present embodiment is a liquid crystal display device which utilizes a liquid crystal composition to display an image. The display device 1 includes a display panel (liquid crystal display panel) 10 capable of detecting information of the position where a user gives input based on the displayed image, a flexible printed circuit (FPC) 20 connected to the display panel 10, and an integrated circuit chip 30 configured to drive and control the display panel 10, such as an LSI chip.

The display panel 10 not only displays an image in a display region AA but also has a touch panel (TP) function to detect contact and/or approach of a director to the display region AA.

The display panel 10, as shown in FIG. 1, has a vertically long quadrangular overall shape (for example, a rectangular shape) whose long sides extend in the Y-axis direction and short sides extend in the X-axis direction. The display panel 10 is divided into a display region (active area) AA, which is capable of displaying an image, and a non-display region (non-active area) NAA, which has a frame shape surrounding the display region AA and is incapable of displaying an image. This display panel 10 includes the display region AA at a position close to one end (upper side in FIG. 1) in the long-side direction. The non-display region NAA includes a substantially frame-shaped region (frame in the later-described color filter substrate 11a) surrounding the display region AA and a region formed on the other end side (lower side in FIG. 1) in the long-side direction (exposed portion not overlapping a color filter substrate 11a in the later-described array substrate 11b). The latter includes a mounting region where a FPC 20 and an integrated circuit chip 30 configured to drive the display panel 10 are mounted.

The FPC 20 is a flexible printed board which has a connector CN and a plurality of conductive lines (not shown). One end of each conductive line is connected to the connector CN. The FPC 20 connects the display panel 10 (guest) to a control circuit board (not shown) of an external device (host), which is a signal source. The connector CN connects the control circuit board and the FPC 20. The other end of each conductive line of the FPC 20 includes a terminal (not shown) by which the display panel 10 and the FPC 20 are connected.

The integrated circuit chip 30 drives and controls display of an image in the display region AA and drives and controls detection of contact and/or approach of a director to the display region AA, for example. In other words, as shown in FIG. 4, the integrated circuit chip 30 includes a liquid crystal driver 31 configured to display an image in the display region AA and a touch sensor drive controller 32 configured to execute the TP function. The touch sensor drive controller 32 includes a capacitance detector 32a configured to detect capacitance by supplying a sensor signal to each of the later-described common electrodes 16 to cause the common electrode 16 to function as a sensor electrode, and a touch detector 32b configured to detect contact and/or approach of a director based on a change in the capacitance.

The display panel 10 includes a pair of substrates, and a liquid crystal layer held between the substrates and containing liquid crystal molecules, which are a substance whose optical characteristics are changed by voltage application. The substrates are bonded to each other by a sealant, with a gap equal to the thickness of the liquid crystal layer in between.

As shown in FIG. 2, the front surface side (front side) substrate of the pair of substrates is a color filter substrate 11a, and the back surface side (back side) substrate is an array substrate 11b. The color filter substrate 11a and the array substrate 11b each include a highly light-transmissive glass substrate, and are each obtained by stacking various films on the glass substrate by a known technique such as photolithography.

The color filter substrate 11a has, as shown in FIG. 1, substantially the same short-side size as the array substrate 11b, but has a shorter long-side size than the array substrate 11b. The color filter substrate 11a is bonded to the array substrate 11b, with the ends on one side in the long-side direction (the upper side in FIG. 1) of the substrates aligned. The end on the other side in the long-side direction (the lower side in FIG. 1) of the array substrate 11b in a predetermined region does not overlap the color filter substrate 11a as shown in FIG. 2, so that both front and back surfaces of the substrate are exposed. The above mounting region is in this exposed portion.

On the liquid crystal layer side surface of each of the array substrate 11b and the color filter substrate 11a is disposed an alignment film (not shown) configured to align liquid crystal molecules in the liquid crystal layer. To the surface remote from the liquid crystal layer of each of the array substrate 11b and the color filter substrate 11a is bonded a polarizer (not shown).

The configuration in the display region AA in each of the array substrate 11b and the color filter substrate 11a is described. In the display region AA on the inner surface side (the liquid crystal layer side, which is the surface facing the color filter substrate 11a) of the array substrate 11b, as shown in FIG. 1, thin-film transistors (TFTs) 12, which are switching elements, and pixel electrodes 13 are formed in a matrix pattern, and the TFTs 12 and the pixel electrodes 13 are surrounded by gate lines 14 and source lines 15 formed in a grid pattern. Each gate line 14 and each source line 15 are connected to the gate electrode and the source electrode of the corresponding TFT 12, respectively. Each pixel electrode 13 is connected to the drain electrode of the corresponding TFT 12. Each gate line 14 is connected to a liquid crystal driver 31 (in particular, gate driver 31a) via a gate lead line (not shown) formed in the non-display region NAA. Each source line 15 is connected to the liquid crystal driver 31 (in particular, source driver 31b) via a source lead line (not shown) formed in the non-display region NAA.

Each pixel electrode 13 has a vertically long quadrangular shape in a plan view. The array substrate 11b includes common electrodes 16, each of which generates an electric field with the corresponding pixel electrode 13 when a common potential (reference potential) is supplied. In other words, in the display panel 10 of the present embodiment, the pixel electrodes 13 and the common electrodes 16 are formed on the array substrate 11b side, while the pixel electrodes 13 and the common electrodes 16 are formed in different layers.

Each pixel electrode 13 is provided with slits 13a formed obliquely to the X-axis direction and the Y-axis direction in a plan view and spaced from each other. When a potential difference is generated between the pixel electrode 13 and the corresponding common electrode 16, fringe electric fields (oblique electric fields) are generated by the slits 13a. With the fringe electric fields, the alignment of liquid crystal molecules in the liquid crystal layer is switchable as appropriate. In other words, the display panel 10 in the present embodiment is a fringe field switching (FFS) mode liquid crystal display device.

Each common electrode 16 is driven by the integrated circuit chip 30 to display an image and as a sensor electrode (TP pad) for touch detection. The common electrodes 16 correspond to segments obtained by dividing an electrode provided in the entire display region AA. As shown in FIG. 3, the common electrodes 16 each have a quadrangular shape of a size enough to face the corresponding pixel electrode 13 among the pixel electrodes 13 arranged in rows and columns (in the X-axis direction and the Y-axis direction) within the display region AA, and are formed in a matrix pattern in the X-axis direction and the Y-axis direction. In other words, the common electrodes 16 are formed as if tiles are laid. Each common electrode 16 is led to the mounting region of the integrated circuit chip 30 by the corresponding sensor line 16a, and is connected to the capacitance detector 32a of the touch sensor drive controller 32 in the integrated circuit chip 30.

Each common electrode 16 forms certain capacitance (parasitic capacitance) with an overlapping conductive member such as a gate line 14. When a director approaches a common electrode 16, new capacitance is generated between the director and the common electrode 16. The present embodiment employs a self-capacitive touch detection function configured to detect contact and/or approach of a director by detecting this change in capacitance, but may employ a mutual-capacitive touch detection function.

In the present embodiment, as shown in FIG. 3, the display region AA is divided, and LCD time and TP time are taken. The LCD time is time to input a drive signal for display of an image to the common electrode 16 in each divided region. The TP time is at the end of each LCD time and is time to detect, using the common electrodes 16, information of the position where a user gives input based on the displayed image. Thereby, an image is displayed during the LCD time by driving the common electrodes 16, while a TP signal is acquired by driving the common electrodes 16 as TP pads during the TP time. The display panel 10 can therefore have both the display function to display an image and the position input function to detect information of the position where a user gives input based on the displayed image. For example, when the number of frames per second is 60 frames (60 Hz), the TP scanning is executed twice per frame, which results in a TP scanning report rate of 120 Hz.

In the display region AA on the inner surface side (the liquid crystal layer side, which is the surface facing the array substrate 11b) of the color filter substrate 11a are disposed color filters arranged in a matrix pattern such that colored portions including red (R), green (G), and blue (B) portions are superimposed on the corresponding pixel electrodes 13 on the array substrate 11b side in a plan view.

In the non-display region NAA on the array substrate 11b of the display panel 10, an inspection line 71 surrounds the display region AA along the edge of the display panel 10. The inspection line 71, which is routed mainly on the liquid crystal panel 10, is formed in the region outside the gate lines 14, the gate lead lines, the source lines 15, and source lead lines (in the region closer to the edge of the array substrate 11b), and is not electrically connected to any of the conductive lines and electrodes disposed within the display region AA.

The inspection line 71 includes a conductive line portion 71a and a wide portion 71b having a greater width than the conductive line portion 71a. Since the capacitance increases in proportion to the area, the capacitance of the conductive line portion, which is linear, is small, and is difficult to detect. The present embodiment therefore employs the wide portion 71b, which is two-dimensionally wide and has a certain area. This allows generation of detectable constant capacitance (parasitic capacitance) between the inspection line 71 and a ground layer 71c (e.g., a conductive member disposed in a layer (metallic gate layer) with the gate lines 14 formed therein and overlapping the inspection line 71). Thus, the wide portion 71b functions as a capacitance-forming portion, and the capacitance-forming portion overlaps the ground layer. The parasitic capacitance of the inspection line 71 including the wide portion 71b is, for example, 10 to 100 pF. In the case where the above conductive member is not disposed in the region overlapping the wide portion 71b, a conductive member may be separately disposed as the ground layer 71c in the region overlapping the wide portion 71b.

The conductive line portion 71a is a member formed in the same layer as the gate lines 14 or the source lines 15, and formed of the same material as the gate lines 14 or the source lines 15. The conductive line portion 71a is, for example, a layer containing a metal such as titanium, aluminum, molybdenum, copper, or chromium, or an alloy thereof.

The wide portion 71b is a member formed in the same layer as the common electrodes 16, and formed of the same material as the common electrodes 16. The wide portion 71b is, for example, an electrode pad formed of a transparent conductive film material such as indium tin oxide (ITO), indium zinc oxide (IZO), zinc oxide (ZnO), or tin oxide (SnO), or an alloy thereof. The conductive line portion 71a and the wide portion 71b are electrically connected through a contact hole, for example. The wide portion 71b may be formed of the same material as the conductive line portion 71a by increasing the width of the conductive line portion 71a. In this case, the conductive line portion 71a and the wide portion 71b are formed in the same layer.

On the FPC 20, an inspection line 72 is formed along the edge of the FPC 20 and surrounds the other conductive lines connected to the connector CN. The inspection line 72, which is routed mainly on the FPC 20, is formed in the region outside the other conductive lines connected to the connector CN on the FPC 20 (in the region closer to the edge of the FPC 20), and is not connected to the connector CN at least on the FPC 20.

The inspection line 72 includes a conductive line portion 72a and a wide portion 72b having a greater width than the conductive line portion 72a. The wide portion 72b of the inspection line 72 is two-dimensionally wide and has a certain area as in the inspection line 71 and is disposed on the display panel 10. This allows generation of detectable constant capacitance (parasitic capacitance) between the inspection line 72 and the ground layer 71c (e.g., a conductive member disposed in a layer (metallic gate layer) with the gate lines 14 formed therein and overlapping the inspection line 72). Thus, the wide portion 72*b* functions as a capacitance-forming portion.

The parasitic capacitance of the inspection line 72 is, for example, 10 to 100 pF. In the case where the above conductive member is not disposed in the region overlapping the wide portion 72*b*, a conductive member may be separately disposed as the ground layer 71*c* in the region overlapping the wide portion 72*b*. Part of the conductive line portion 72*a* on the display panel 10 can be formed in the same manner as the conductive line portion 71*a*, and part of the conductive line portion 72*a* on the FPC 20 can be formed of the same material as the other conductive lines on the FPC 20 by, for example, patterning copper foil. The wide portion 72*b* can be formed in the same manner as the wide portion 71*b*.

The inspection lines 71 and 72 are each electrically connected to the capacitance detector 32*a* of the touch sensor drive controller 32 in the integrated circuit chip 30. The integrated circuit chip 30 including the touch sensor drive controller 32 can input the same inspection signal (e.g., quadrangular wave) as the sensor signal to the inspection lines 71 and 72 and measure the capacitance of each of the inspection lines 71 and 72 using the capacitance detector 32*a* in the touch sensor drive controller 32 even without a new circuit in the integrated circuit chip 30.

Good display devices without any defects such as open circuits are produced under the same conditions based on the same design. The inspection lines 71 and 72 including the wide portions 71*a* and 72*a* (capacitance-forming portions) exhibiting capacitance, respectively, in good display devices 1 therefore exhibit capacitance within a predetermined range, though slightly varying. However, if the conductive line portion 71*a* of the inspection line 71 or the conductive line portion 72*a* of the inspection line 72 is at least open-circuited, partially open-circuited, or short-circuited, the capacitance of the inspection line 71 or 72 goes beyond the predetermined range. For example, when the conductive line portion 71*a* or 72*a* is open-circuited or partially open-circuited, the capacitance of the inspection line 71 or 72 decreases to below the predetermined range. When the conductive line portion 71*a* or 72*a* is short-circuited, the capacitance of the inspection line 71 or 72 increases to above the predetermined range. With this in consideration, the capacitance of each of the inspection lines 71 and 72 in a good display device 1 without any defects such as open circuits, partial open circuits, or short circuits is measured in advance to set the predetermined thresholds as the good-product reference capacitance values for the inspection lines 71 and 72. Then, the capacitance of each of the inspection lines 71 and 72 in the target display device 1 is compared with the predetermined threshold. Thereby, each of the inspection lines 71 and 72 in the target display device 1 can be inspected for open circuits, partial open circuits, and short circuits (i.e., each of the inspection lines 71 and 72 can be inspected to determine whether or not the inspection lines 71 and 72 are at least open-circuited, partially open-circuited, or short-circuited). The predetermined thresholds can be set by preparing, for example, 20 good display devices 1 without any defects such as open circuits, and measuring the capacitance of each of the inspection lines 71 and 72 in each display device 1.

A crack and a chip in a display device in many cases occur over a range (region) to some extent, and neighboring conductive lines on the same substrate are likely to be open-circuited and/or partially open-circuited collectively. This means that when the inspection line 71 or 72 is open-circuited and/or partially open-circuited, a conductive line near the inspection line 71 or 72 is highly likely to be open-circuited and/or partially open-circuited. Also, when a conductive line is short-circuited, it is short-circuited with one or more conductive lines adjacent thereto. Thus, when the inspection line 71 or 72 is short-circuited, at least one conductive line adjacent to the inspection line 71 or 72 is highly likely to be short-circuited. In light of this issue, the present embodiment employs the inspection line 71 formed along the edge of the display panel 10 and the inspection line 72 formed along the edge of the FPC 20, so as to be able to inspect conductive lines near the inspection lines 71 and 72, i.e., near the edge of the display panel 10 and the edge of the FPC 20, which are especially vulnerable to an external shock, for open circuits, partial open circuits, and short circuits.

In the display device 1 of the present embodiment, each of the inspection lines 71 and 72 has capacitance, and thus no special member such as a conductive plate is needed to be stacked on a transparent substrate before substrate bonding as mentioned in JP 2000-250057 A. Unlike JP 2000-250057 A, the present embodiment allows inspection of conductive lines for open circuits, partial open circuits, and short circuits after production of the display panel 10 and bonding of the display panel 10 to the FPC 20. The present embodiment therefore allows inspection of conductive lines in the display device 1 after shipping for open circuits, partial open circuits, and short circuits.

In the inspection method for open circuits using the above determination line, the determination line is simply a conductive line, and thus occurrence of an open circuit is determined based on whether or not an inspection signal is detected. Hence, when an inspection signal is detected by a partially open-circuited, but partially connected determination line, a determination may be made that the determination line is not open-circuited. When the determination line is short-circuited with a conductive line to which no potential is supplied, an inspection signal is detected as in the case where the conductive line is not defective. Hence, a short circuit cannot be detected using the above determination line. In contrast, the inspection lines 71 and 72 in the present embodiment each include a capacitance-forming portion, allowing detection of capacitance of each of the inspection lines 71 and 72. When the inspection line 71 or 72 is open-circuited, the capacitance thereof decreases significantly. When the inspection line 71 or 72 is partially open-circuited, the capacitance thereof decreases, though not as much as in the case of an open circuit. When the inspection line 71 or 72 is short-circuited with a conductive line to which no potential is supplied, the capacitance of the conductive line is added to increase the capacitance of the inspection line 71 or 72. When the inspection line 71 or 72 is short-circuited with a conductive line at a fixed potential, the capacitance of the inspection line 71 or 72 cannot be measured. The present embodiment therefore enables inspection of conductive lines for not only open circuits but also partial open circuits and short circuits based on the degree of change in capacitance of the inspection lines 71 and 72.

In the present embodiment, the capacitance detector 32*a* of the touch sensor drive controller 32 is utilized, so that the capacitance of each of the inspection lines 71 and 72 can be measured. A separate circuit for measuring the capacitance is not necessary to provide the display device 1 with a conductive line inspection function. The capacitance of each of the inspection lines 71 and 72 can be measured with, for example, an integrator (integration circuit) in the capacitance detector 32a.

Also in the present embodiment, since the capacitance of each of the inspection lines 71 and 72 can be measured using the capacitance detector 32a, the wide portion 71b of the inspection line 71 and the wide portion 72b of the inspection line 72 can be used as TP pads for touch detection. When the inspection lines 71 and 72 are not open-circuited or partially open-circuited, bringing a director into contact with the wide portions 71b and 72b causes emission of a signal (TP signal) which increases the capacitance of each of the inspection lines 71 and 72. When the inspection line 71 is open-circuited or partially open-circuited at a site in a route RP from the capacitance detector 32a of the touch sensor drive controller 32 in the integrated circuit chip 30 to the wide portion 71b, bringing a director into contact with the wide portion 71b does not change or only slightly changes the capacitance of the inspection line 71, causing emission of no TP signal. Likewise, when the inspection line 72 is open-circuited or partially open-circuited at a site in a route RF from the capacitance detector 32a of the touch sensor drive controller 32 in the integrated circuit chip 30 to the wide portion 72b, bringing a director into contact with the wide portion 72b does not change or only slightly changes the capacitance of the inspection line 72, causing emission of no TP signal.

As described above, the present embodiment allows easy inspection of the inspection lines 71 and 72 for open circuits and partial open circuits based on whether or not a TP signal is detected when the wide portion 71b or 72b is touched during use of the wide portions 71b and 72b as TP pads, without comparing the capacitance of each of the inspection lines 71 and 72 with the predetermined threshold.

The display panel 10 of the present embodiment is a liquid crystal display panel having the TP function. The display panel 10 can therefore inspect conductive lines in the display region AA for open circuits, partial open circuits, and short circuits by the same method as the method for inspecting the inspection lines 71 and 72, using the TP pad within the display region AA. In other words, the display device 1 of the present embodiment can inspect conductive lines in both inside and outside the display region AA for open circuits, partial open circuits, and short circuits.

In the case of connecting a display panel and a FPC by pressure bonding using an anisotropic conductive film (ACF) in production of a display device including the display panel and the FPC, insufficient pressure bonding of the display panel and the FPC may connect the conductive lines on the display panel and the conductive lines on the FPC insufficiently, causing an open circuit or a partial open circuit. When the inspection line 72 is formed over the FPC 20 and the display panel 10 and the display panel 10 and the FPC 20 are connected to each other by pressure bonding using an ACF, insufficient pressure bonding may cause an open circuit and/or a partial open circuit of the inspection line 72. This means that when the measured capacitance of the inspection line 72 is below the predetermined threshold, a determination may be made that the conductive lines are open-circuited and/or partially open-circuited due to improper pressure bonding using an ACF.

In the case where pressure bonding between the display panel and the integrated circuit chip is insufficient in connection of the integrated circuit chip and the display panel using an ACF, open circuits and/or partial open circuits may occur between a conductive line on the display panel 10 and a terminal on the integrated circuit chip. In the present embodiment, the inspection lines 71 and 72 are formed, starting from a chip connection terminal connected to a bump on the integrated circuit chip 30. This may cause the inspection line 71 or 72 to be open-circuited and/or partially open-circuited if the pressure bonding is insufficient in connecting the integrated circuit chip 30 to the display panel 10 using an ACF. This means that when the measured capacitance of the inspection line 71 or 72 is below the predetermined threshold, a determination may be made that the inspection line is open-circuited and/or partially open-circuited due to improper pressure bonding using an ACF.

The conductive line portion 71a is routed from a chip connection terminal connected to a bump of the integrated circuit chip 30 toward one of the two long sides of the display panel 10. The conductive line portion 71a is extended along the one long side of the display panel 10, the short side not connected to the FPC 20 of the two short sides of the display panel 10, and the other long side. The conductive line portion 71a is then electrically connected to the wide portion 71b formed near the corner formed by the other long side and the short side connected to the FPC 20. The inspection line 71 surrounds the display region AA along the edge of the display panel 10 in this manner. This structure enables wider-range inspection of conductive lines near the edge of the display panel 10 for open circuits, partial open circuits, and short circuits.

The conductive line portion 72a is routed from a chip connection terminal connected to a bump of the integrated circuit chip 30 toward the other of the two long sides of the display panel 10 (the long side opposite to the side toward which the conductive line portion 71a is extended). The conductive line portion 72a is extended along the edge of the FPC 20 except for the site connected to the display panel 10, and then electrically connected to the wide portion 72b formed near the corner formed by the one long side and the short side connected to the FPC 20 of the display panel 10. The inspection line 72 surrounds the connector CN and the region with conductive lines connected to the connector CN along the edge of the FPC 20 in this manner. This structure enables wider-range inspection of conductive lines near the edge of the FPC 20 for open circuits, partial open circuits, and short circuits.

The two inspection lines 71 and 72 are formed along the entire edge of the display panel 10 except for the site connected to the FPC 20 and along the entire edge of the FPC 20 except for the site connected to the display panel 10. This structure enables especially wide-range inspection of conductive lines near the edge of the display panel 10 and the edge of the FPC 20 for open circuits, partial open circuits, and short circuits. The "entire edge" may be "substantially the entire edge".

The wide portions 71b and 72b are positioned at (connected to) one end of the conductive line portion 71a and one end of the conductive line portion 72a, respectively. This structure enables the conductive line portions 71a and 72a to be formed along the edge of the display panel 10 and the edge of the FPC 20, respectively, over a long distance, enabling wider-range inspection of conductive lines for open circuits, partial open circuits, and short circuits.

The wide portions 71b and 72b may have any shape as long as they can exhibit capacitance. The shape of each of the wide portions 71b and 72b may be, for example, a quadrangular shape as with the common electrodes 16. The wide portions 71b and 72b in the present embodiment are formed in a portion of the non-display region NAA where the array substrate 11b and the color filter substrate 11a do not overlap each other. The wide portions 71b and 72b may be formed in a portion of the non-display region NAA where the array substrate 11b and the color filter substrate 11a overlap each other.

The conductive line portion 71a and the wide portion 71b may have any size. The width of the conductive line portion 71a is, for example, 50 μm. The area of the wide portion 71b is, for example, 1 to 4 mm². The conductive line portion 72a and the wide portion 72b may each have any size. The width of the conductive line portion 72a is, for example, 50 μm. The area of the wide portion 72b is, for example, 1 to 4 mm².

The cross-sectional structures of the portions where the wide portions 71b and 72b are formed are described with reference to FIG. 2. Although FIG. 2 shows the conductive line portion 71a and the wide portion 71b, the portion where the wide portion 72b is formed has the same cross-sectional structure as the portion where the wide portion 71b is formed. As shown in FIG. 2, a protective member such as a glass substrate for the color filter substrate 11a is not disposed on the upper surface of each of the wide portions 71b and 72b. Thus, a protective member such as a removable seal with an adhesive is preferably applied to the upper surface of each of the wide portions 71b and 72b or the upper surface of each of the wide portions 71b and 72b is preferably covered with a moisture-proof insulating material (e.g., moisture-proof resin). This structure allows the protective member to be removed or the insulating material to be peeled when each of the wide portions 71b and 72b is used as a TP pad, and allows the wide portions 71b and 72b to be protected by the protective member or the insulating material when the wide portions 71b and 72b are not used as TP pads. This can reduce time during which the wide portions 71b and 72b are exposed, thereby preventing the wide portions 71b and 72b from being corroded due to exposure.

Embodiment 2

Figure 5:
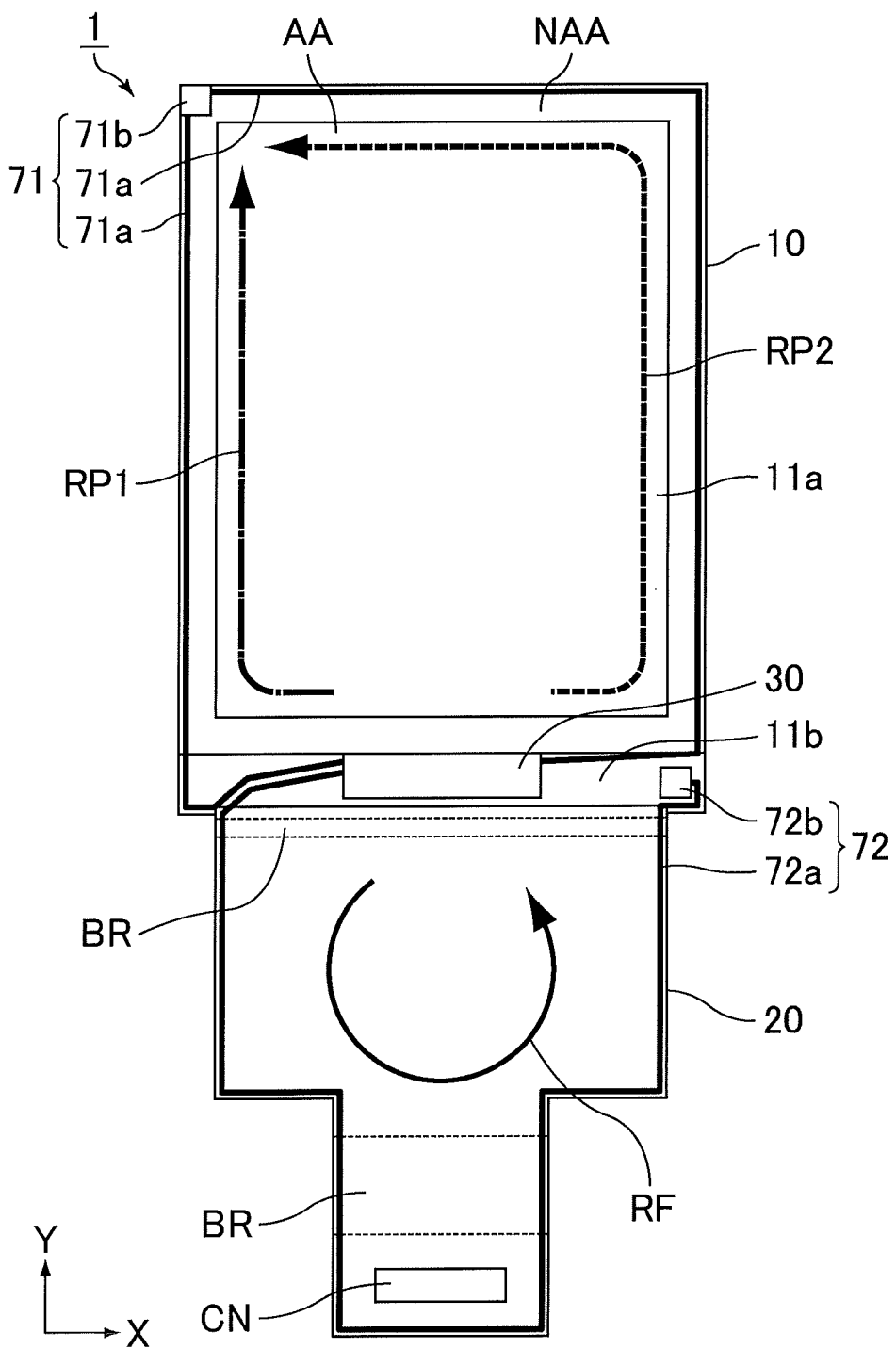
FIG. 5 is a schematic plan view of a display device of Embodiment 2.

The features unique to the present embodiment are mainly described in the present embodiment, and the same features as those in Embodiment 1 will not be elaborated upon here. The wide portion 71b is formed at an end of the conductive line portion 71a formed along the edge of the display panel 10 in Embodiment 1. In the present embodiment, the wide portion 71b is formed in an intermediate portion of the conductive line portion 71a formed along the edge of the display panel 10. FIG. 5 is a schematic plan view of a display device of Embodiment 2.

As shown in FIG. 5, the inspection line 71, which is formed along the edge of the display panel 10 and routed mainly on the display panel 10, includes the wide portion 71b in an intermediate portion of the conductive line portion 71a and is connected at both ends to the capacitance detector 32a of the touch sensor drive controller 32 in the integrated circuit chip 30. The display panel 10 has two routes (routes RP1 and RP2) through which an inspection signal is input.

When an inspection signal is input to the conductive line portion 71a through the route RP1, which is a clockwise route, the capacitance of the inspection line 71 decreases from the predetermined threshold in the case where the conductive line portion 71a is open-circuited and/or partially open-circuited at a site on the left side before the wide portion 71b. The capacitance of the inspection line 71 remains within the threshold range in the case where the conductive line portion 71a is not open-circuited or partially open-circuited, i.e., not defective, at the site on the left side. Likewise, when an inspection signal is input to the conductive line portion 71a through the route RP2, which is a counterclockwise route, the capacitance of the inspection line 71 decreases from the predetermined threshold in the case where the conductive line portion 71a is open-circuited and/or partially open-circuited at a site on the right side before the wide portion 71b. The capacitance of the inspection line 71 remains within the threshold range in the case where the conductive line portion 71a is not open-circuited or partially open-circuited, i.e., not defective, at the site on the right side. The wide portion 71b formed in an intermediate portion of the conductive line portion 71a therefore enables inspection of conductive lines on the left side of the display panel 10 for open circuits and partial open circuits and inspection of conductive lines on the right side for open circuits and partial open circuits. This can specify the open-circuited and/or partially open-circuited site(s) of the conductive line(s) on the display panel 10. As in the above embodiment, the inspection line 71 can be inspected for short circuits based on whether or not the capacitance of the inspection line 71 in the present embodiment is above the predetermined threshold.

In the present embodiment, the inspection line 72, which is formed along the edge of the FPC 20 and routed mainly on the FPC 20, includes the wide portion 72b at an end of the conductive line portion 72a. Yet, the inspection line 72 on the FPC 20 side may include the wide portion 72b in an intermediate portion of the conductive line portion 72a and the conductive line portion 72a may be connected at both ends to the capacitance detector 32a. This structure can also specify the open-circuited and/or partially open-circuited site(s) of the conductive line(s) on the FPC 20, as with the display panel 10.

Embodiment 3

Figure 6:
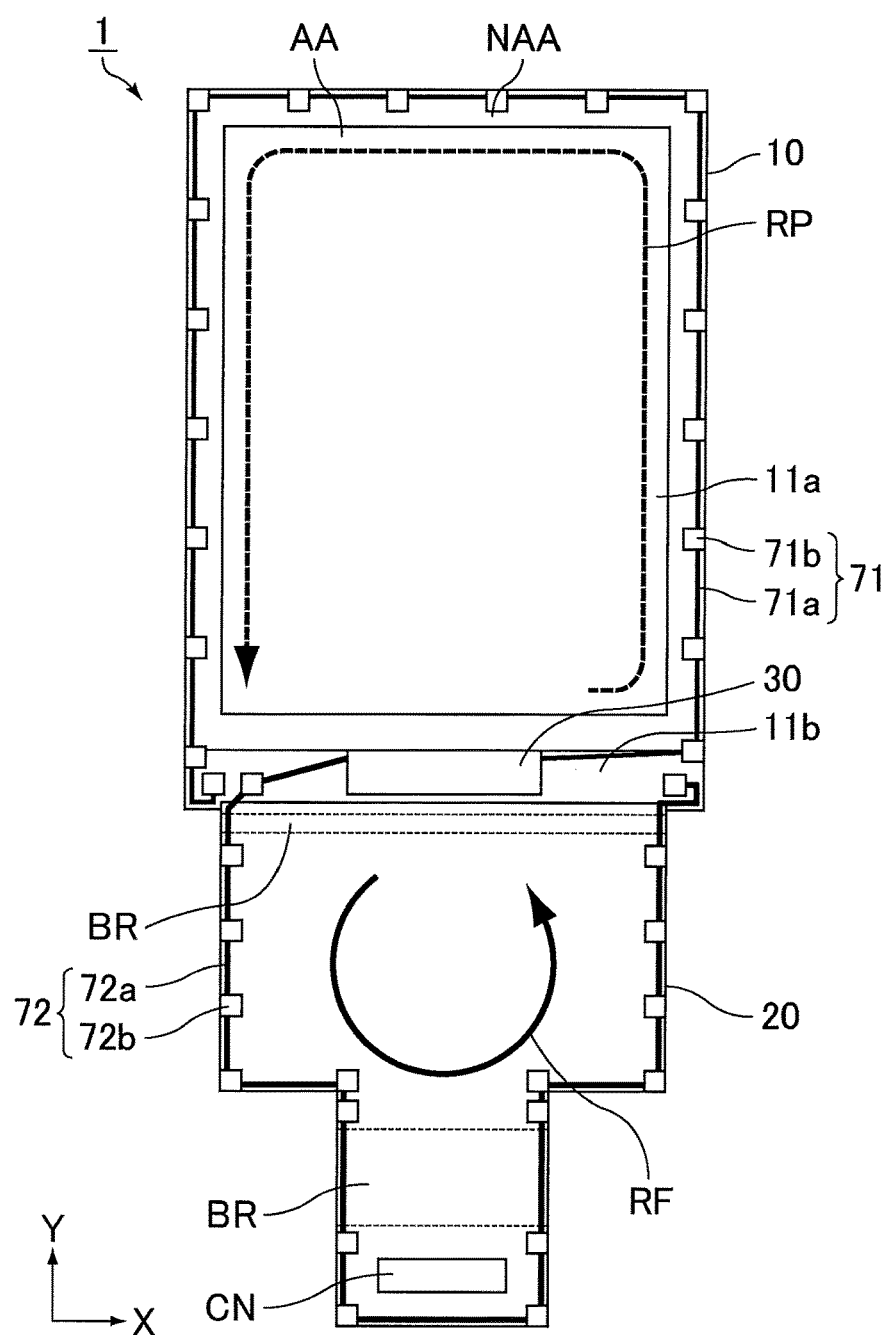
FIG. 6 is a schematic plan view of a display device of Embodiment 3.
Figure 7:
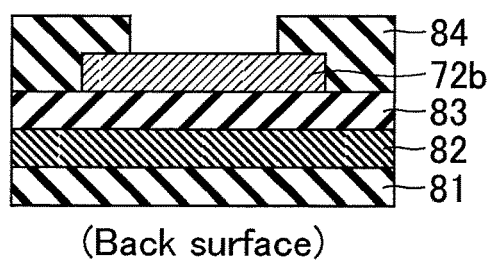
FIG. 7 is a schematic cross-sectional view of the vicinity of a wide portion formed on a FPC in the display device of Embodiment 3.

The features unique to the present embodiment are mainly described in the present embodiment, and the same features as those in the above embodiments will not be elaborated upon here. In the above embodiments, the inspection lines 71 and 72 include one wide portion 71b and one wide portion 72b, respectively. In the present embodiment, the inspection line 71 includes a plurality of the wide portions 71b, and the inspection line 72 includes a plurality of the wide portions 72b. FIG. 6 is a schematic plan view of a display device of Embodiment 3. FIG. 7 is a schematic cross-sectional view of the vicinity of a wide portion formed on a FPC in the display device of Embodiment 3.

As shown in FIG. 6, the inspection line 71, which is formed along the edge of the display panel 10 and routed mainly on the display panel 10, includes the conductive line portion 71a and a plurality of the wide portions 71b. In the intermediate portion of the conductive line portion 71a, the wide portions 71b, spaced from each other, are electrically connected to the conductive line portion 71a.

The inspection line 72, which is formed along the edge of the FPC 20 and routed mainly on the FPC 20, includes the conductive line portion 72a and a plurality of the wide portions 72b. In the intermediate portion of the conductive line portion 72a, the wide portions 72b, spaced from each other, are electrically connected to the conductive line portion 72a.

As described above, in the present embodiment, the wide portions 71b exhibiting capacitance are connected in parallel and the wide portions 72b exhibiting capacitance are connected in parallel. The capacitance values of the inspection lines 71 and 72 in a good display device 1 without defects such as open circuits are substantially equal to the sum of the capacitance values of the wide portions 71b and the sum of the capacitance values of the wide portions 72b, respectively. However, for example, when part of each of the inspection lines 71 and 72 is open-circuited, the capacitance of the part after the open-circuited site is not included in the capacitance of each of the inspection lines 71 and 72, so that the capacitance of each of the inspection lines 71 and 72 decreases as much as the capacitance of the part after the open-circuited site.

The capacitance values of the inspection lines 71 and 72 correspond, respectively, to the cumulative values of the capacitance values of the electrically connected wide portions 71b and 72b from the side where an inspection signal is input. Hence, the open-circuited site of each of the inspection lines 71 and 72 can be roughly specified by setting a predetermined threshold as a good-product reference for each of the inspection lines 71 and 72 and determining how much the capacitance of the inspection line 71 or 72 of the target product decreased from the threshold. Setting the capacitance as a good-product reference for each of the wide portions 71b and each of the wide portions 72b enables comparison of the amount decreased from the threshold with the capacitance of each of the wide portions 71b and 72b, further specifying the open-circuited site of each of the inspection lines 71 and 72.

The capacitance values of the wide portions 71b are preferably equal to each other, and the capacitance values of the wide portions 72b are preferably equal to each other. The equal capacitance values may be substantially equal capacitance values. This structure increases the capacitance of each of the inspection lines 71 and 72 in proportion to the number of the wide portions 71b and the number of the wide portions 72b, respectively, enabling further specification of the open-circuited site of a conductive line. A case is described, as an example, where the inspection line 71 includes 19 wide portions 71b and the capacitance values of the 19 wide portions 71b are equal to each other. When the capacitance values of the wide portions 71b are equal to each other, the capacitance of the inspection line 71 increases in proportion to the number of the wide portions 71b electrically connected. For example, when the capacitance of the inspection line 71 of the target display device 1 decreases to $16/19$ of the capacitance of the inspection line 71 of a good display device 1, the open-circuited site of the inspection line can be supposed to be between the 16th wide portion 71b and the 17th wide portion 71b from the integrated circuit chip 30 side, and thus the open-circuited site of the conductive line can be further specified. Also with the inspection line 72, it is possible to further specify the open-circuited site of a conductive line by the same technique.

The areas of the wide portions 71b are preferably equal to each other, and the areas of the wide portions 72b are preferably equal to each other. The equal areas may be substantially equal areas. Setting the areas of the wide portions 71b to be equal to each other can easily make the capacitance values of the wide portions 71b equal to each other. Also, setting the areas of the wide portions 72b to be equal to each other can easily make the capacitance values of the wide portions 72b equal to each other.

At least two wide portions 72b among the wide portions 72b of the inspection line 72 are preferably formed with a bending portion BR of the FPC 20, which is easily breakable, in between. This structure enables easy inspection of conductive lines in the bending portion BR of the FPC 20, which is easily breakable, for open circuits, partial open circuits, and short circuits.

The structure around each wide portion 72b on the FPC 20 is described with reference to FIG. 7. At each site on the FPC 20 where a wide portion 72b is disposed, a coverlay 81, a ground layer 82 which is grounded, a base film 83, and a wide portion 72b are sequentially stacked from the back surface side of the FPC 20 toward the front surface side. The end of each wide portion 72b and the conductive line portion 72a on the FPC 20 are covered with the coverlay 84. The coverlays 81 and 84 are insulating protective films. The FPC 20 of the liquid crystal display device 1 in each of Embodiments 1 and 2 is supposed to be a single-sided circuit board. The FPC 20 in the present embodiment may be a double-sided circuit board, which has conductive lines (ground layer 82 and wide portions 72b) on both surfaces of a base film 83.

As shown in FIG. 7, at least part of the upper surface of each wide portion 72b on the FPC 20 is exposed. Thus, as with the wide portion 72b on the display panel 10 in Embodiment 1, a protective member such as a removable seal with an adhesive is preferably applied to the upper surface of each of the wide portions 72b or the upper surface of each of the wide portions 72b is preferably covered with a moisture-proof insulating material (e.g., moisture-proof resin). Also, the upper surface of each of the wide portions 72b on the FPC is preferably covered with a coverlay. This structure allows the wide portions 72b to be protected by the coverlay and allows the coverlay to be removed when each of the wide portions 72b is used as a TP pad. This can reduce time during which the wide portions 72b are exposed, thereby preventing the wide portions 72b from being corroded due to exposure.

Embodiment 4

Figure 8:
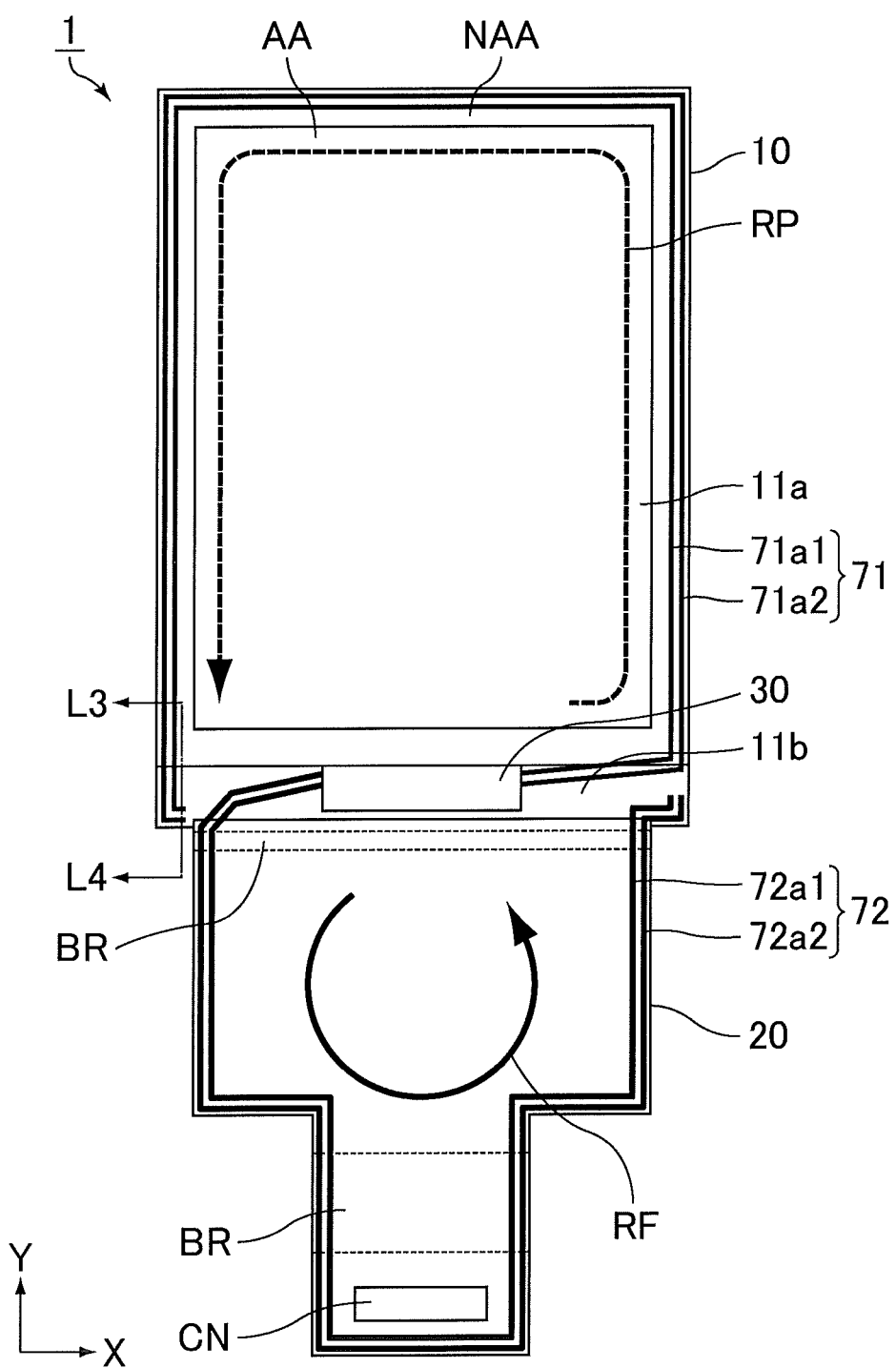
FIG. 8 is a schematic plan view of a display device of Embodiment 4.
Figure 9:
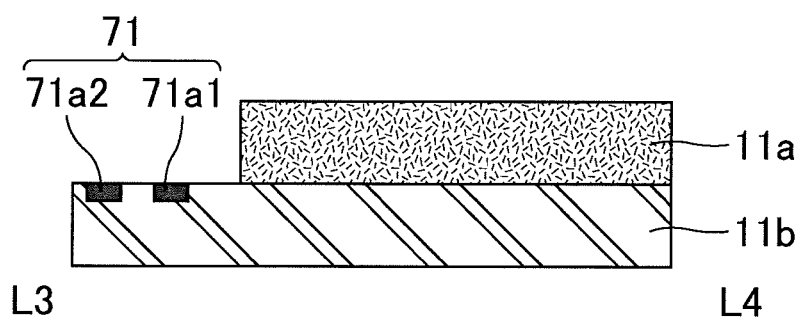
FIG. 9 is a schematic cross-sectional view of a display panel in the display device of Embodiment 4.

The features unique to the present embodiment are mainly described in the present embodiment, and the same features as those in the above embodiments will not be elaborated upon here. In Embodiments 1 to 3, the inspection lines 71 and 72 include the wide portions 71b and 72b, respectively. In the present embodiment, each of the inspection lines 71 and 72 include two conductive line portions side by side as the capacitance-forming portions. In Embodiments 1 to 3, the wide portions 71b and 72b on the liquid crystal panel 10 overlap (are formed above or below) another conductive member on the liquid crystal panel 10 for generation of capacitance. In the present embodiment, assuming that the wide portions 71b and 72b on the liquid crystal panel 10 may not overlap another conductive member on the liquid crystal panel 10, the members for capacitance generation are arranged parallel to each other (formed side by side). In Embodiment 3, the wide portion 72b formed on one surface of the FPC 20 overlaps the ground layer 82 formed on the other surface for capacitance generation, on the assumption that a double-sided FPC 20 is used. In the present embodiment, a single-sided circuit board is assumed to be used, and the capacitance-forming members are formed side by side. FIG. 8 is a schematic plan view of a display device of Embodiment 4. FIG. 9 is a schematic cross-sectional view of a display panel in the display device of Embodiment 4.

As shown in FIGS. 8 and 9, the inspection line 71, which is formed along the edge of the display panel 10 and routed mainly on the display panel 10, includes two parallel conductive line portions 71a1 and 71a2 as the capacitance-forming portions. The conductive line portion 71a1 functions as a ground line (GND line) as it is grounded via the integrated circuit chip 30. This causes the two conductive line portions 71a1 and 71a2 to form a capacitor, generating capacitance of a predetermined size between the two conductive line portions 71a1 and 71a2. The space between the two conductive line portions 71a1 and 71a2 is not particularly limited, and may appropriately be set according to the desired capacitance. For example, the space may fall within the range of 1 to 20 μm. In the present embodiment, the conductive line portion 71a2 is formed between the conductive line portion 71a1 functioning as a ground line and the edge of the liquid crystal panel 10. Yet, the conductive line 71a1 may be formed between the conductive line 71a2 and the edge of the liquid crystal panel 10.

Likewise, the inspection line 72, which is formed along the edge of the FPC 20 and routed mainly on the FPC 20, includes two parallel conductive line portions 72a1 and 72a2 as the capacitance-forming portions. The conductive line portion 72a1 functions as a ground line (GND line) as it is grounded via the integrated circuit chip 30. This causes the two conductive line portions 72a1 and 72a2 to form a capacitor, generating capacitance of a predetermined size between the two conductive line portions 72a1 and 72a2. The space between the two conductive line portions 72a1 and 72a2 is not particularly limited, and may appropriately be set according to the desired capacitance. For example, the space may fall within the range of 1 to 20 μm. In the present embodiment, the conductive line portion 72a2 is formed between the conductive line portion 72a1 functioning as a ground line and the edge of the FPC 20. Yet, the conductive line 72a1 may be formed between the conductive line 72a2 and the edge of the FPC 20.

Each of the conductive line portions 71a2 and 72a2 is connected to the capacitance detector 32a of the touch sensor drive controller 32 in the integrated circuit chip 30, functions as a detection line, and receives an inspection signal input to inspect conductive lines for open circuits, partial open circuits, and short circuits.

The inspection line 71 including the two conductive line portions 71a1 and 71a2 (capacitance-forming portions) exhibiting predetermined capacitance values exhibits, if it is of a good display device 1, capacitance within the predetermined threshold range. However, when one or both of the conductive line portions 71a1 and 71a2 of the inspection line 71 is/are open-circuited and/or partially open-circuited, the capacitance of the inspection line 71 decreases to below the predetermined threshold, depending on the open-circuited and/or partially open-circuited site. With the open-circuited and/or partially open-circuited site closer to the integrated circuit chip 30 side end of the inspection line 71, the decline in the capacitance of the inspection line 71 is more likely to be large. Thus, monitoring the capacitance between the two conductive line portions 71a1 and 71a2 and comparing it with the predetermined threshold enable inspection of the inspection line 71 in the target display device 1 for open circuits and partial open circuits, roughly specifying the open-circuited and/or partially open-circuited site(s). The inspection line 72 including the two conductive line portions 72a1 and 72a2 (capacitance-forming portions) can be inspected for open circuits and partial open circuits in the same manner, and the open-circuited and/or partially open-circuited site(s) can be roughly specified. When the capacitance of the inspection line 71 increases, a determination can be made that one or both of the conductive line portions 71a1 and 71a2 is/are short-circuited. When the capacitance of the inspection line 72 increases, a determination can be made that one or both of the conductive line portions 72a1 and/or 72a2 is/are short-circuited.

A material exhibiting the same dielectric constant over its entire length is preferably disposed between the parallel conductive line portions 71a1 and 71a2, and the space between the two conductive line portions 71a1 and 71a2 is preferably the same over the lengths of the conductive line portions. This structure causes the capacitance of the inspection line 71 to increase in proportion to the length of the two conductive line portions 71a1 and 71a2. Thus, the open-circuited site of the inspection line 71 in the inspection target can be more easily specified depending on how much the capacitance of the inspection line 71 of the inspection target display device 1 decreased from the predetermined threshold. For example, when the measured capacitance of the inspection line 71 is approximately 40% of the predetermined threshold capacitance, a prediction can be made that the site approximately 40% from the touch sensor drive controller 32 side end of one or both of the conductive line portions 71a1 and 71a2 is open-circuited. From the same viewpoint, a material exhibiting the same dielectric constant over its entire length is preferably disposed between the parallel conductive line portions 72a1 and 72a2, and the space between the two conductive line portions 72a1 and 72a2 is preferably the same over the entire lengths of the conductive line portions. The entire length may be substantially entire length. The same space may be substantially the same space. A material having the same dielectric constant may be a material having substantially the same dielectric constant, and may be the same material (including substantially the same material).

In the present embodiment, the two conductive line portions 71a1 and 71a2 are formed side by side in the same layer. Yet, the two conductive line portions 71a1 and 71a2 may be stacked as the upper layer and the lower layer with an insulating layer in between. Likewise, the two conductive line portions 72a1 and 72a2 are formed side by side in the same layer. Yet, the portions thereof on the display panel 10 may be stacked as the upper layer and the lower layer with an insulating layer in between. The parts of the conductive line portions 72a1 and 72a2 on the FPC 20 may be stacked as a front surface layer and a back surface layer with a base film in between.

Embodiment 5

The features unique to the present embodiment are mainly described in the present embodiment, and the same features as those in the above embodiments will not be elaborated upon here. In Embodiments 1 to 4, the capacitance values of the inspection lines 71 and 72 are measured using the capacitance detector 32a of the touch sensor drive controller 32 in the integrated circuit chip 30. In the present embodiment, the case where the touch sensor drive controller 32 is not installed in the integrated circuit chip 30 is described. Also, the present embodiment differs from Embodiments 1 to 4 in that one inspection line is routed over both the liquid crystal panel 10 and the FPC 20.

Figure 10:
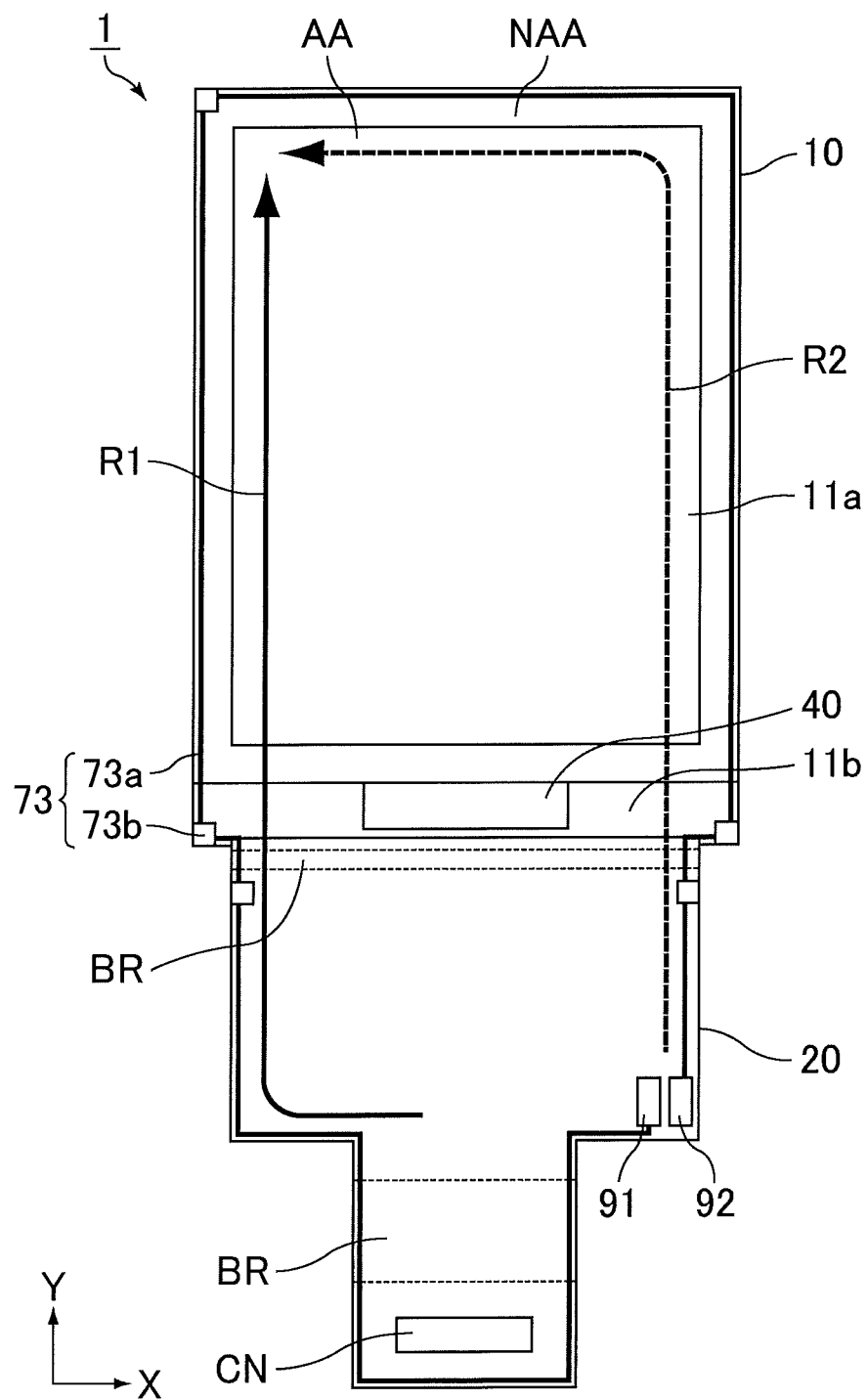
FIG. 10 is a schematic plan view of a display device of Embodiment 5.

In the present embodiment, an external pad is provided to the display device and an inspection device different from the inspection target display device is connected to the external pad, so that the capacitance of the inspection line is measured. The display device of the present embodiment is therefore preferably applied to a display device without a touch detection function in the display panel. FIG. 10 is a schematic plan view of a display device of Embodiment 5.

The display panel 10 in the display device 1 of the present embodiment has no touch detection function, unlike the display panels 10 of Embodiments 1 to 4. An integrated circuit chip 40 includes no touch sensor drive controller 32. The display device 1 of the present embodiment includes two external pads (first external pad 91 and second external pad 92) at the edge of the FPC 20, and an inspection line 73 formed on the liquid crystal panel 10 and the FPC 20.

The inspection line 73 includes a conductive line portion 73a and a plurality of wide portions 73b. One end of the conductive line portion 73a is electrically connected to the first external pad 91, and the other end of the conductive line portion 73a is electrically connected to the second external pad 92. Also, the wide portions 73b are formed in an intermediate portion of the conductive line portion 73a. The wide portions 73b include first and second panel wide portions 73b formed at the respective two corners of the display panel 10 near the site connected to the FPC 20, a third panel wide portion 73b formed at a corner other than the above two corners, and first and second FPC wide portions 73b formed on the FPC 20 near the first and second panel wide portions 73b. On the display panel 10 and the FPC 20 are formed two routes (routes R1 and R2) through which an inspection signal is input.

In the present embodiment, an inspection signal for detection of capacitance of the inspection line 73 is input from an external inspection device through the external pad 91 or 92 and the capacitance of the inspection line 73 can be measured using the external inspection device through the external pad 91 or 92. Hence, the display device 1 without the touch sensor drive controller 32 can inspect conductive lines for open circuits, partial open circuits, and short circuits.

When an inspection signal is input from the first external pad 91 to the conductive line portion 73a through the route R1, which is a clockwise route, and the capacitance of the inspection line 73 decreases significantly from the predetermined threshold, a prediction can be made that the inspection line is open-circuited and/or partially open-circuited at a site on the left side of the display panel 10 and the FPC 20. When an inspection signal is input from the second external pad 92 to the conductive line portion 73a through the route R2, which is a counterclockwise route, and the capacitance of the inspection line 73 decreases significantly from the predetermined threshold, a prediction can be made that the inspection line is open-circuited and/or partially open-circuited at a site on the right side of the display panel 10 and the FPC 20.

With the external pads 91 and 92 at the respective ends of the conductive line portion 73a and the wide portions 73b in the intermediate portion of the conductive line portion 73a, conductive lines can be inspected for open circuits and/or partial open circuits through two routes, so that the open-circuited and/or partially open-circuited site(s) of the inspection line can be specified.

In the present embodiment, the wide portions 73b are formed on both the display panel 10 and the FPC 20, with which the open-circuited and/or partially open-circuited site(s) of conductive line(s) can be specified to the display panel 10 side or to the FPC 20 side. Also, since the first panel wide portion 73b and the first FPC wide portion 73b and the second panel wide portion 73b and the second FPC wide portion 73b are formed to sandwich the connection site between the display panel 10 and the FPC 20 and the bending portion BR of the FPC 20, conductive lines can be inspected for open circuits, partial open circuits, and short circuits at these sites.

One inspection line 73 is formed along the entire edge of the display panel 10 except for the site connected to the FPC 20 and the entire edge of the FPC 20 except for the site connected to the display panel 10. This enables especially wide-range inspection of conductive lines near the edge of the display panel 10 and the edge of the FPC 20 for open circuits, partial open circuits, and short circuits. From this viewpoint, the first external pad 91 and the second external pad 92 are preferably adjacent to each other.

In the present embodiment, the first external pad 91 and the second external pad 92 are formed at the edge of the FPC 20. Yet, the first external pad 91 and the second external pad 92 may be formed anywhere. For example, the first external pad 91 and the second external pad 92 may be formed on the display panel 10, or one of the first external pad 91 and the second external pad 92 may be formed on the display panel 10 and the other on the FPC 20.

With the two external pads 91 and 92 formed as in the present embodiment, the open-circuited site of the inspection line can be specified in the case where one wide portion 73b is formed in the intermediate portion (especially the center portion) of the conductive line portion 73a. Still, with the plurality of the wide portions 73b in the intermediate portion of the conductive line portion 73a as in Embodiment 3, the open-circuited site of the inspection line can be further specified.

In the present embodiment, the inspection line 73 including the conductive line portion 73a and the wide portions 73b. Yet, an inspection line including two parallel conductive line portions may be used as in Embodiment 4. In this case, one of the two conductive line portions is grounded through an external pad connected to its end, and the other conductive line portion receives an inspection signal from an external inspection device through an external pad connected to its end.

In the present embodiment, the external pads 91 and 92 are formed at the respective ends of the inspection line 73. Yet, an external pad may be formed only at one end of the inspection line 73. In this case, an inspection line including a conductive line portion and a plurality of wide portions may be used or an inspection line including two parallel conductive line portions may be used, so that an open-circuited site of the inspection line can be specified.

In the present embodiment, the external pads 91 and 92 are formed at the respective ends of the inspection line 73. Yet, the external pads 91 and 92 may be formed at sites other than the ends of the inspection line 73 (for example, in the intermediate portion of the inspection line 73).

Embodiment 6

Figure 11:
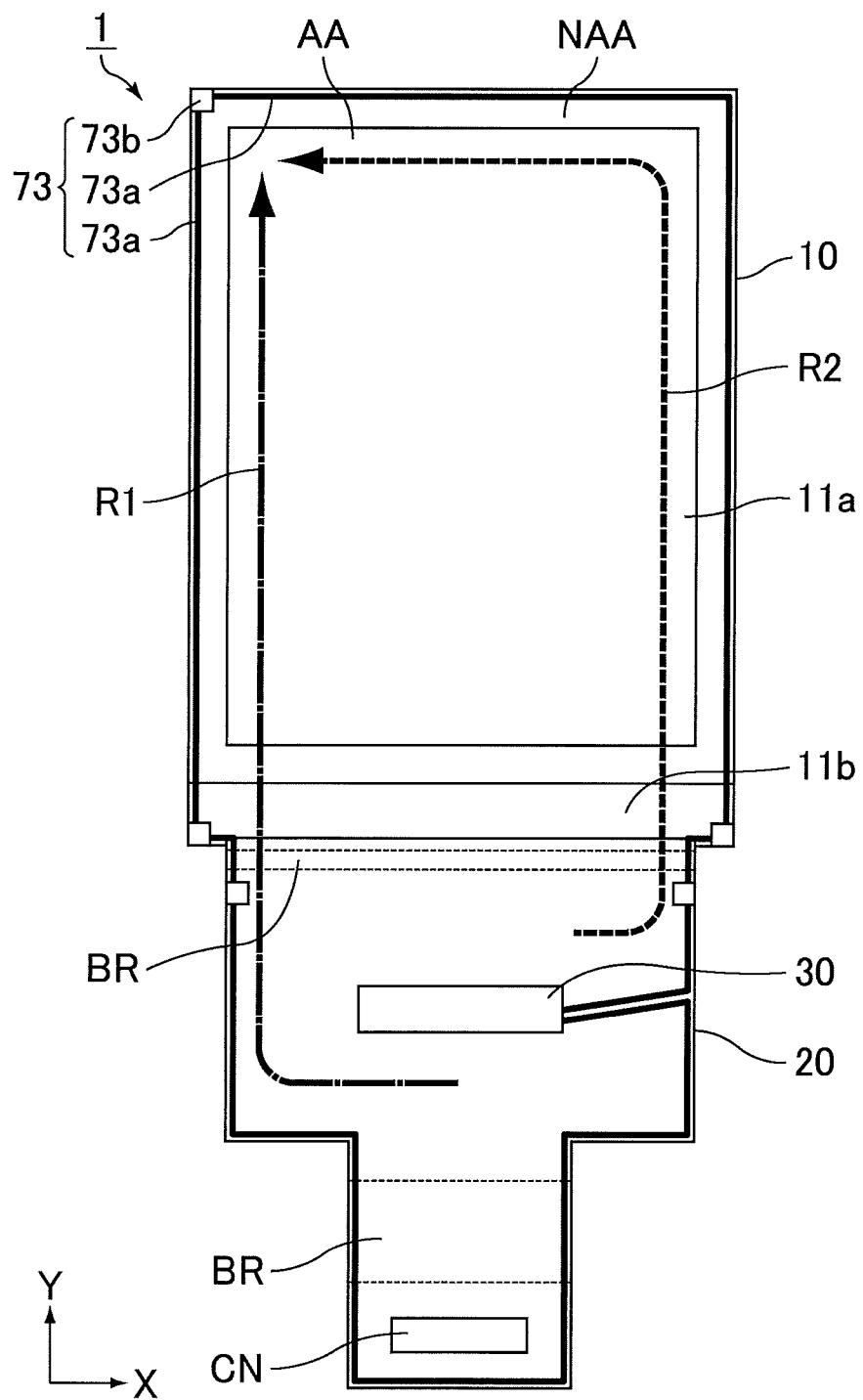
FIG. 11 is a schematic plan view of a display device of Embodiment 6.

The features unique to the present embodiment are mainly described in the present embodiment, and the same features as those in the above embodiments will not be elaborated upon here. In Embodiments 1 to 4, the integrated circuit chip 30 including the liquid crystal driver 31 and the touch sensor drive controller 32 is disposed on the liquid crystal panel 10. In the present embodiment, an integrated circuit chip including a liquid crystal driver and a touch sensor drive controller is mounted on a FPC. In other words, the present embodiment employs a FPC (chip on film (COF)) on which an integrated circuit chip including a liquid crystal driver and a touch sensor drive controller is mounted. Also, the present embodiment differs from Embodiments 1 to 4 in that the inspection line 73 is routed over both the liquid crystal panel 10 and the FPC 20, and differs from Embodiment 5 in that the integrated circuit chip includes both the liquid crystal driver and the touch sensor drive controller. FIG. 11 is a schematic plan view of a display device of Embodiment 6.

As shown in FIG. 11, the FPC 20 in the display device 1 of the present embodiment is supposed to be a double-sided circuit board. On the front surface of the FPC 20 is mounted the integrated circuit chip 30 including the liquid crystal driver 31 and the touch sensor drive controller 32. In the present embodiment, the integrated circuit chip 30 is mounted on the front surface side of the FPC 20. Yet, the integrated circuit chip 30 may be mounted on the back surface side of the FPC 20.

The inspection line 73, which is formed along the edge of the display panel 10 and the edge of the FPC 20 and routed on the display panel 10 and the FPC 20, includes the conductive line portion 73a and a plurality of the wide portions 73b. Each end of the conductive line portion 73a is electrically connected to the capacitance detector 32a of the touch sensor drive controller 32 in the integrated circuit chip 30. The wide portions 73b are formed in the intermediate portion of the conductive line portion 73a. The wide portions 73b include the first and second panel wide portions 73b formed at the respective two corners of the display panel 10 near the site connected to the FPC 20, the third panel wide portion 73b formed at a corner other than the above two corners, and the first and second FPC wide portions 73b formed on the FPC 20 near the first and second panel wide portions 73b. On the display panel 10 and the FPC 20 are formed the two routes (routes R1 and R2) through which an inspection signal is input.

The display device 1 forms capacitance by overlapping the first, second, and third panel wide portions 73b and other conductive members on the liquid crystal panel 10, and also forms capacitance by overlapping the first and second FPC wide portions 73b formed on one surface of the double-sided FPC 20 and the conductive member (ground layer) formed on the other surface.

When an inspection signal is input to the conductive line portion 73a through the clockwise route R1 and the capacitance of the inspection line 73 decreases significantly from the predetermined threshold, a prediction can be made that a conductive line is open-circuited and/or partially open-circuited at a site on the left side of the display panel 10 and the FPC 20. When an inspection signal is input to the conductive line portion 73a through the counterclockwise route R2 and the capacitance of the inspection line 73 decreases significantly from the predetermined threshold, a prediction can be made that a conductive line is open-circuited and/or partially open-circuited at a site on the right side of the display panel 10 and the FPC 20.

As described above, with the conductive line portion 73a being electrically connected at each end to the capacitance detector 32a and the wide portions 73b formed in the intermediate portion of the conductive line portion 73a, conductive lines can be inspected for open circuits and/or partial open circuits through two routes, so that the open-circuited and/or partially open-circuited site(s) of the conductive line(s) can be specified.

Embodiment 7

Figure 12:
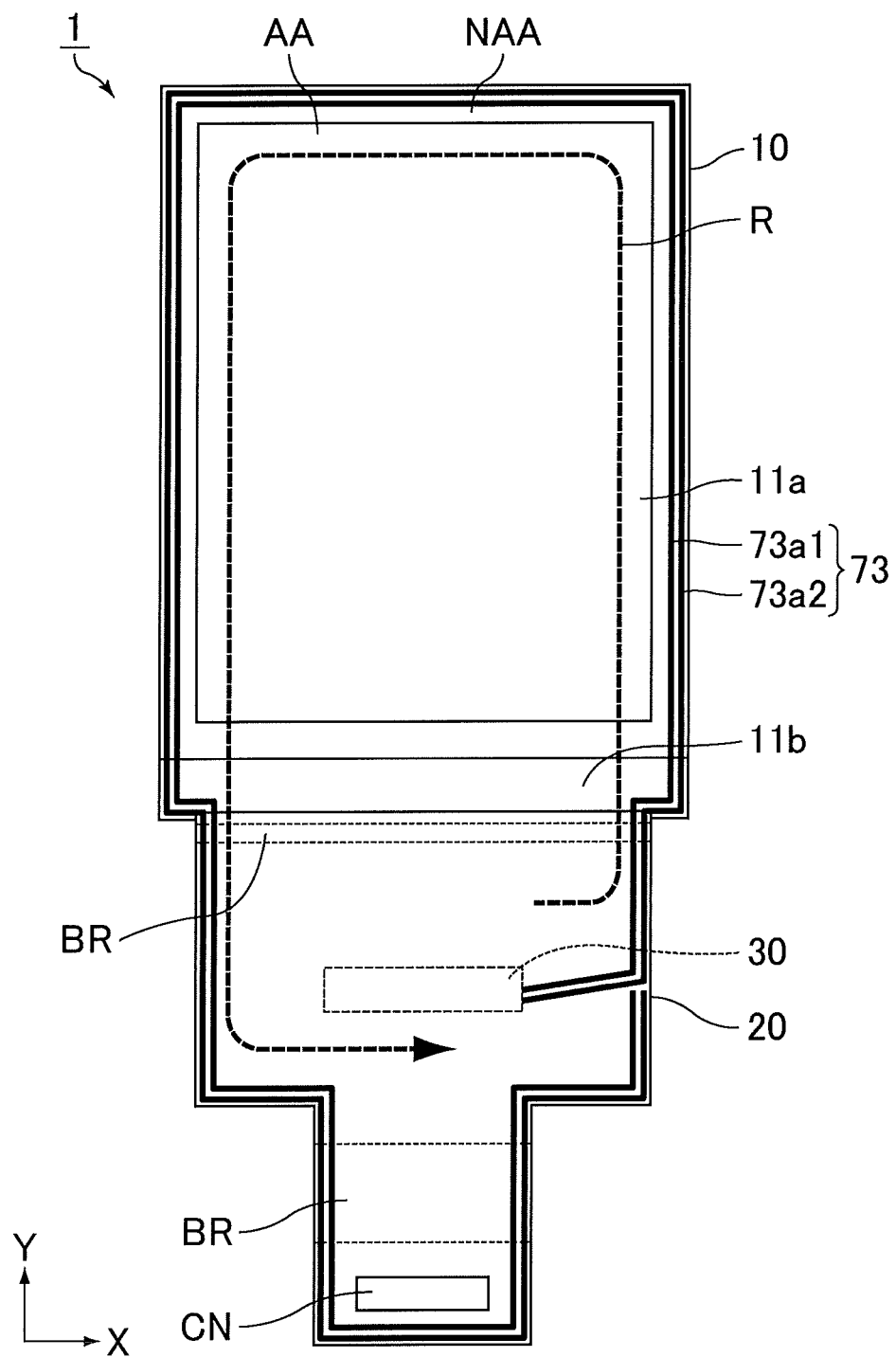
FIG. 12 is a schematic plan view of a display device of Embodiment 7.

The features unique to the present embodiment are mainly described in the present embodiment, and the same features as those in the above embodiments will not be elaborated upon here. In Embodiments 1 to 4, the integrated circuit chip 30 including the liquid crystal driver 31 and the touch sensor drive controller 32 is disposed on the liquid crystal panel 10. In the present embodiment, an integrated circuit chip including a liquid crystal driver and a touch sensor drive controller is mounted on the FPC. In other words, the present embodiment employs the COF. Also, the present embodiment differs from Embodiment 6 in that the inspection line 73 routed on the liquid crystal panel 10 and the FPC 20 includes two parallel conductive line portions as the capacitance-forming portions. FIG. 12 is a schematic plan view of a display device of Embodiment 7.

As shown in FIG. 12, the FPC 20 in the display device 1 of the present embodiment is supposed to be a single-sided circuit board. On the back surface side of the FPC 20 is mounted the integrated circuit chip 30 including the liquid crystal driver 31 and the touch sensor drive controller 32.

The inspection line 73, which is formed along the edge of the display panel 10 and the edge of the FPC 20 and routed on the display panel 10 and the FPC 20, includes two parallel conductive line portions 73a1 and 73a2 as the capacitance-forming portions. The conductive line portion 73a1 functions as a ground line as it is grounded via the integrated circuit chip 30. This causes the two conductive line portions 73a1 and 73a2 to form a capacitor, generating capacitance of a predetermined size between the two conductive line portions 73a1 and 73a2. The space between the two conductive line portions 73a1 and 73a2 is not particularly limited, and may appropriately be set according to the desired capacitance. For example, the space may fall within the range of 1 to 20 μm. In the present embodiment, the conductive line portion 73a2 is formed between the conductive line portion 73a1 functioning as a ground line and the edge of the liquid crystal panel 10. Yet, the conductive line 73a1 may be formed between the conductive line 73a2 and the edge of the liquid crystal panel 10.

The conductive line portion 73a2 is connected to the capacitance detector 32a of the touch sensor drive controller 32 in the integrated circuit chip 30, functions as a detection line, and receives an inspection signal for inspection for open circuits, partial open circuits, and short circuits. As with the inspection lines 71 and 72 in Embodiment 4, conductive lines can be inspected for open circuits, partial open circuits, and short circuits, using the inspection line 73 in the present embodiment including the conductive line portions 73a1 and 73a2.

Embodiment 8

The features unique to the present embodiment are mainly described in the present embodiment, and the same features as those in the above embodiments will not be elaborated upon here. In the present embodiment, the method for producing the display device of any one of Embodiments 1 to 7 is described.

The method for producing the display device 1 according to the present embodiment is a method for producing the display device 1 including the display panel 10 and the FPC 20, the method including forming, along the edge of the display panel 10 and the edge of the FPC 20, the inspection lines 71 and 72 (or 73) including a capacitance-forming portion that exhibits capacitance, connecting the FPC 20 to the display panel 10, and measuring capacitance of the inspection lines 71 and 72 (or 73) after the connecting so as to inspect the inspection lines 71 and 72 (or 73) for open circuits, partial open circuits, or short circuits based on the measured capacitance.

In the display device 1, each of the inspection lines 71 and 72 (or 73) has capacitance, and thus no special member such as a conductive plate is needed to be stacked on a transparent substrate before substrate bonding as mentioned in JP 2000-250057 A. Unlike JP 2000-250057 A, the present embodiment allows inspection of conductive lines for open circuits, partial open circuits, and short circuits after production of the display panel 10 and mounting of the FPC 20 on the display panel 10.

In the forming, portions of the inspection lines 71 and 72 (or 73) formed on the display panel 10 can be formed simultaneously with the other conductive lines or electrodes of the display panel 10. The portions of the inspection lines 71 and 72 (or 73) formed on the FPC 20, for example, can be formed simultaneously with the other conductive lines formed on the FPC 20.

The inspecting may include comparing the capacitance of each of the inspection lines 71 and 72 (or 73) with the predetermined threshold. This process enables determination of whether or not each conductive line is open-circuited, partially open-circuited, and/or short-circuited based on whether or not the measured capacitance is within the predetermined threshold range. For example, when the measured capacitance is within the predetermined threshold range, a determination can be made that the inspection lines 71 and 72 (or 73) are not open-circuited, partially open-circuited, or short-circuited. When the measured capacitance is out of the predetermined threshold range, a determination can be made that the inspection lines 71 and 72 (or 73) are at least open-circuited, partially open-circuited, or short-circuited.

In the case where the inspection lines 71 and 72 (or 73) include the wide portions 71b and 72b (or 73b), respectively, the inspecting may include bringing a director into contact or closer to each of the wide portions 71b and 72b (or 73b). This process enables easy inspection of the inspection line 71 and 72 (or 73) for open circuits and partial open circuits based on whether or not a TP signal is emitted when the wide portion 71b or 72b (or 73b) is touched.

Embodiment 9

The features unique to the present embodiment are mainly described in the present embodiment, and the same features as those in the above embodiments will not be elaborated upon here. The present embodiment describes the method for inspecting the display device of any one of Embodiments 1 to 7.

The method for inspecting the display device 1 according to the present embodiment is a method for inspecting the display device 1 including the display panel 10 and the FPC 20. The method includes measuring capacitance of each of the inspection lines 71 and 72 (or 73) formed along one or both of the edge of the display panel 10 and the edge of the FPC 20 and including the capacitance-forming portion(s) that exhibit(s) capacitance so as to inspect the inspection lines 71 and 72 (or 73) for open circuits, partial open circuits, and short circuits based on the measured capacitance values.

In the display device 1, each of the inspection lines 71 and 72 (or 73) has capacitance, and thus no special member such as a conductive plate is needed to be stacked on a transparent substrate before substrate bonding as mentioned in JP 2000-250057 A. Unlike JP 2000-250057 A, the present embodiment allows inspection of conductive lines for open circuits, partial open circuits, and short circuits after production of the display panel 10 and mounting of the FPC 20 on the display panel 10.

The inspecting may include comparing the capacitance of each of the inspection lines 71 and 72 (or 73) with the predetermined threshold. This process enables determination of whether or not each conductive line is open-circuited, partially open-circuited, and/or short-circuited based on whether or not the measured capacitance is within the predetermined threshold range. For example, when the measured capacitance is within the predetermined threshold range, a determination can be made that the inspection lines 71 and 72 (or 73) are not open-circuited, partially open-circuited, or short-circuited. When the measured capacitance is out of the predetermined threshold range, a determination can be made that the inspection lines 71 and 72 (or 73) are at least open-circuited, partially open-circuited, or short-circuited.

In the case where the inspection lines 71 and 72 (or 73) include the wide portions 71b and 72b (or 73b), respectively, the inspecting may include bringing a director into contact or closer to each of the wide portions 71b and 72b (or 73b). This process enables easy inspection of the inspection line 71 and 72 (or 73) for open circuits and partial open circuits based on whether or not a TP signal is emitted when the wide portion 71b or 72b (or 73b) is touched.

MODIFIED EXAMPLE 1

In Embodiments 1 to 4, the cases are described where the inspection lines 71 and 72 are formed on the display panel 10 and the FPC 20, respectively. The inspection line 71 or 72 alone may be formed only on the display panel 10 or the FPC 20. In Embodiments 5 to 7, the cases are described where the inspection line 73 is formed on the display panel 10 and the FPC 20. Yet, the inspection line 73 may be formed only on the display panel 10 or the FPC 20.

MODIFIED EXAMPLE 2

In the embodiments other than Embodiment 5, the liquid crystal driver 31 and the touch sensor drive controller 32 are mounted on the integrated circuit chip 30. Yet, the liquid crystal driver 31 and the touch sensor drive controller 32 may be formed in different integrated circuit chips.

MODIFIED EXAMPLE 3

In each of the embodiments, the case is described where at least one inspection line is formed along the entire edge of the display panel 10 except for the site connected to the FPC 20 and the entire edge of the FPC 20 except for the site connected to the display panel 10. Yet, the inspection line may be formed anywhere on each of the display panel 10 and the FPC 20. For example, the inspection line 71 may be formed along only the upper and right two sides of the four sides of the display panel 10 shown in FIG. 1.

MODIFIED EXAMPLE 4

The display devices 1 of the embodiments other than Embodiment 5 each include an in-cell touch panel including the common electrodes 16 capable of functioning as a sensor electrode. Yet, the common electrodes 16 may not have the TP function. A sensor electrode may be disposed on the front surface side of the color filter substrate 11a, separately from the common electrodes 16, so that an on-cell touch panel is formed.

MODIFIED EXAMPLE 5

In each of the embodiments, the case is described where the display panel 10 is a liquid crystal display panel. The display panel 10 may be a display panel in a different display mode from liquid crystal display panels, such as an organic electroluminescent panel or a plasma display panel.

MODIFIED EXAMPLE 6

In each of the embodiments, the case is described where the display panel 10 has a quadrangular shape. Yet, the display panel 10 may be a panel having a shape other than a quadrangular shape.

MODIFIED EXAMPLE 7

In Embodiments 1 to 4, the cases are described where the inspection line routed on the display panel 10 and the inspection line routed on the FPC 20 both include wide portion(s) or two parallel conductive line portions as the capacitance-forming portion(s). Yet, one of the inspection lines may include wide portion(s) as the capacitance-forming portion(s) and the other of the inspection lines may include two parallel conductive line portions as the capacitance-forming portions.

MODIFIED EXAMPLE 8

In Embodiments 1 to 4, the integrated circuit chip 30 disposed on the liquid crystal panel 10 may be mounted on the FPC 20, and the inspection lines 71 and 72 may be connected to the capacitance detector 32a in the integrated circuit chip 30 on the FPC 20. Likewise, in Embodiment 5, the integrated circuit chip 30 disposed on the liquid crystal panel 10 may be mounted on the FPC 20. Meanwhile, in Embodiments 6 and 7, the integrated circuit chip 30 disposed on the FPC 20 may be mounted on the liquid crystal panel 10, and the inspection line 73 may be connected to the capacitance detector 32a in the integrated circuit chip 30 on the liquid crystal panel 10.

What is claimed is:

1. A display device comprising:
    a display panel;
    a flexible printed circuit connected to the display panel; and
    an inspection line formed along one or both of an edge of the display panel and an edge of the flexible printed circuit and including a capacitance-forming portion that exhibits capacitance,
    the display panel including a display region, which is capable of displaying an image, and a non-display region, which has a frame shape surrounding the display region and is incapable of displaying an image,
    the inspection line being located in the non-display region and including a conductive line portion and, as the capacitance-forming portion, a plurality of wide portions each having a greater width than the conductive line portion, and
    the wide portions being spaced from each other.

2. The display device according to claim 1, wherein at least one of the wide portions is formed at an end of the conductive line portion.

3. The display device according to claim 1, wherein at least one of the wide portions is formed in an intermediate portion of the conductive line portion.

4. The display device according to claim 1, wherein the wide portions exhibit the same capacitance.

5. The display device according to claim 1, further comprising a capacitance detector that is connected to the inspection line and configured to detect capacitance of the inspection line.

6. The display device according to claim 1, further comprising an external pad that is formed on one or both of the display panel and the flexible printed circuit and connected to the inspection line.

7. A method for producing a display device according to claim 1, the method comprising:
    forming, along one or both of an edge of the display panel and an edge of the flexible printed circuit, an inspection line including a capacitance-forming portion that exhibits capacitance;
    connecting the flexible printed circuit to the display panel; and
    measuring capacitance of the inspection line after the connecting so as to inspect the inspection line for open circuits, partial open circuits, or short circuits based on the measured capacitance.

8. The method for producing a display device according to claim 7,
    wherein the inspecting includes comparing the capacitance with a predetermined threshold.

9. The method for producing a display device according to claim 7,
    wherein the inspection line includes a conductive line portion and, as the capacitance-forming portion, a wide portion having a greater width than the conductive line portion, and
    the inspecting includes bringing a director into contact with or close to the wide portion.

10. A method for inspecting a display device according to claim 1,
    the method comprising
    measuring capacitance of the inspection line so as to inspect the inspection line for open circuits, partial open circuits, or short circuits based on the measured capacitance.

11. The method for inspecting a display device according to claim 10,
    wherein the inspecting includes comparing the capacitance with a predetermined threshold.

12. The method for inspecting a display device according to claim 10,
    wherein the inspection line includes a conductive line portion and, as the capacitance-forming portion, a wide portion having a greater width than the conductive line portion, and
    the inspecting includes bringing a director into contact with or closer to the wide portion.

13. A display device comprising:
    a display panel;
    a flexible printed circuit connected to the display panel; and
    an inspection line formed along one or both of an edge of the display panel and an edge of the flexible printed circuit and including a capacitance-forming portion that exhibits capacitance,
    wherein the inspection line is formed along the entire edge of the display panel except for a site connected to the flexible printed circuit and along the entire edge of the flexible printed circuit except for a site connected to the display panel.

14. The display device according to claim 13,
    wherein the inspection line includes a conductive line portion and, as the capacitance-forming portion, a wide portion having a greater width than the conductive line portion.

15. The display device according to claim 14,
wherein the wide portion is formed at an end of the conductive line portion.

16. The display device according to claim 14,
wherein the wide portion is formed in an intermediate portion of the conductive line portion.

17. The display device according to claim 13,
wherein the inspection line includes a conductive line portion and, as the capacitance-forming portion, a plurality of wide portions each having a greater width than the conductive line portion, and
the wide portions are spaced from each other.

18. The display device according to claim 17,
wherein the wide portions exhibit the same capacitance.

19. The display device according to claim 13,
wherein the capacitance-forming portion of the inspection line includes two conductive line portions that are formed side by side, and
one of the two conductive line portions is grounded.

20. The display device according to claim 13, further comprising a capacitance detector that is connected to the inspection line and configured to detect capacitance of the inspection line.

21. The display device according to claim 13, further comprising an external pad that is formed on one or both of the display panel and the flexible printed circuit and connected to the inspection line.

* * * * *